(12) United States Patent
Misawa et al.

(10) Patent No.: US 12,204,104 B2
(45) Date of Patent: *Jan. 21, 2025

(54) VEHICLE

(71) Applicant: MAXELL, LTD., Kyoto (JP)

(72) Inventors: Akio Misawa, Kyoto (JP); Nozomu Shimoda, Kyoto (JP); Kazuomi Kaneko, Kyoto (JP); Koji Hirata, Kyoto (JP); Toshinori Sugiyama, Kyoto (JP)

(73) Assignee: MAXELL, LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/387,541

(22) Filed: Nov. 7, 2023

(65) Prior Publication Data
US 2024/0069341 A1     Feb. 29, 2024

Related U.S. Application Data

(63) Continuation of application No. 17/870,308, filed on Jul. 21, 2022, now Pat. No. 11,846,776, which is a (Continued)

(30) Foreign Application Priority Data

Jul. 7, 2016   (JP) ................................. 2016-134902

(51) Int. Cl.
 *G02B 27/01*   (2006.01)
 *B60K 35/00*   (2006.01)
 (Continued)

(52) U.S. Cl.
CPC .......... *G02B 27/0149* (2013.01); *B60K 35/00* (2013.01); *G02B 27/0101* (2013.01);
(Continued)

(58) Field of Classification Search
CPC ............ G02B 27/0149; G02B 27/0101; G02B 2027/015; G02B 2027/0154; G02B 7/182;
(Continued)

(56) References Cited

U.S. PATENT DOCUMENTS 5,657,163 A * 8/1997 Wu ...................... G02B 6/4298
                                                      359/633
5,760,931 A   6/1998 Saburi et al.
(Continued)

FOREIGN PATENT DOCUMENTS

| CN | 204360017 U | 5/2015 |
| CN | 105404006 A | 3/2016 |

(Continued)

OTHER PUBLICATIONS

International Search Report of PCT/JP2017/016182 dated Jul. 11, 2017.
(Continued)

*Primary Examiner* — James C. Jones
(74) *Attorney, Agent, or Firm* — Mattingly & Malur, PC

(57) ABSTRACT

An object of the present invention is to provide a head-up display apparatus further reduced in size, the head-up display apparatus having: an image display apparatus including a light source and a display element; and a virtual image optical system in which light emitted from the image display apparatus is reflected by a windshield or a combiner of the vehicle so that a virtual image is displayed in front of the vehicle, wherein the virtual image optical system has a concave mirror and a distortion correcting lens, and the distortion correcting lens is disposed between the image display apparatus and the concave mirror, the concave mirror is disposed in a housing including an outer case along a shape of an effective light path area of the image light from
(Continued)

the image display apparatus, and the image display apparatus is attached to part of an outer periphery of the housing.

55 Claims, 21 Drawing Sheets

Related U.S. Application Data continuation of application No. 16/309,471, filed as application No. PCT/JP2017/016182 on Apr. 24, 2017, now Pat. No. 11,487,115.

(51) Int. Cl.
*H05K 7/20* (2006.01)
*B60K 35/21* (2024.01)
*B60K 35/23* (2024.01)

(52) U.S. Cl.
CPC ....... *H05K 7/20336* (2013.01); *H05K 7/2039* (2013.01); *B60K 35/213* (2024.01); *B60K 35/23* (2024.01); *B60K 2360/334* (2024.01); *B60K 2360/691* (2024.01); *G02B 2027/015* (2013.01); *G02B 2027/0154* (2013.01)

(58) Field of Classification Search
CPC ...... G02B 7/198; B60K 35/00; B60K 35/213; B60K 35/23; B60K 2360/334; B60K 2360/691; H05K 7/20336; H05K 7/2039
See application file for complete search history.

(56) References Cited

U.S. PATENT DOCUMENTS

| | | | |
|---|---|---|---|
| 10,031,341 B2 | 7/2018 | Azuma | |
| 10,191,290 B2 | 1/2019 | Ye et al. | |
| 11,487,115 B2 * | 11/2022 | Misawa | H05K 7/20336 |
| 11,846,776 B2 * | 12/2023 | Misawa | G02B 27/0149 |
| 2009/0115975 A1 | 5/2009 | Ogura | |
| 2012/0099032 A1 | 4/2012 | Ishikawa | |
| 2015/0211877 A1 | 7/2015 | Laycock et al. | |
| 2015/0219895 A1 | 8/2015 | Laycock et al. | |
| 2016/0147074 A1 | 5/2016 | Kobayashi et al. | |
| 2016/0195719 A1 | 7/2016 | Yonetani | |
| 2016/0266283 A1 | 9/2016 | Segawa | |
| 2017/0160551 A1 | 6/2017 | Azuma | |
| 2017/0242248 A1 * | 8/2017 | Kuzuhara | G02B 27/0101 |
| 2017/0315351 A1 | 11/2017 | Yamazoe et al. | |
| 2019/0129172 A1 | 5/2019 | Misawa et al. | |

FOREIGN PATENT DOCUMENTS

| | | | |
|---|---|---|---|
| JP | 63-139032 U | 9/1988 | |
| JP | 1-92718 A | 4/1989 | |
| JP | 01-196014 A | 8/1989 | |
| JP | 5-341226 W | 12/1993 | |
| JP | 8-271828 W | 10/1996 | |
| JP | 2000-231009 A | 8/2000 | |
| JP | 2004-226469 A | 8/2004 | |
| JP | 2005-148658 W | 6/2005 | |
| JP | 2006-138950 A | 6/2006 | |
| JP | 2008-134350 A | 6/2008 | |
| JP | 2011-169988 A | 9/2011 | |
| JP | 2012-093506 A | 5/2012 | |
| JP | 2015-59969 A | 3/2015 | |
| JP | 2015-064396 A | 4/2015 | |
| JP | 2015-146011 A | 8/2015 | |
| JP | 2015-528136 A | 9/2015 | |
| JP | 2015-194707 A | 11/2015 | |
| JP | 2015-535092 A | 12/2015 | |
| JP | 2016-009155 A | 1/2016 | |
| JP | 2016-020945 A | 2/2016 | |
| JP | 2016-045388 A | 4/2016 | |
| JP | 2016-101771 W | 6/2016 | |
| JP | 2016-103008 A | 6/2016 | |
| JP | 2018-054715 A | 4/2018 | |
| JP | 6726742 B2 | 7/2020 | |
| WO | 94/14098 A1 | 6/1994 | |
| WO | 2016/101917 A1 | 6/2016 | |

OTHER PUBLICATIONS

Japanese Office Action received in corresponding Japanese Application No. 2018-525950 dated Feb. 4, 2020.
Japanese Office Action received in corresponding Japanese Application No. 2020-111150 dated May 6, 2021.
Japanese Office Action received in corresponding Japanese Application No. 2023-138631 dated Oct. 15, 2024.

* cited by examiner

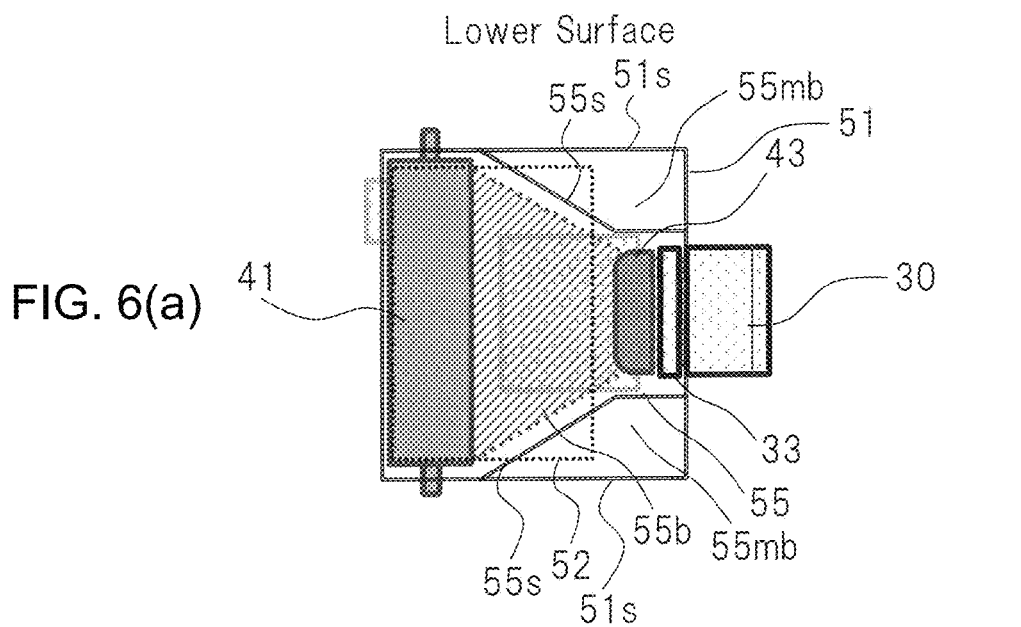
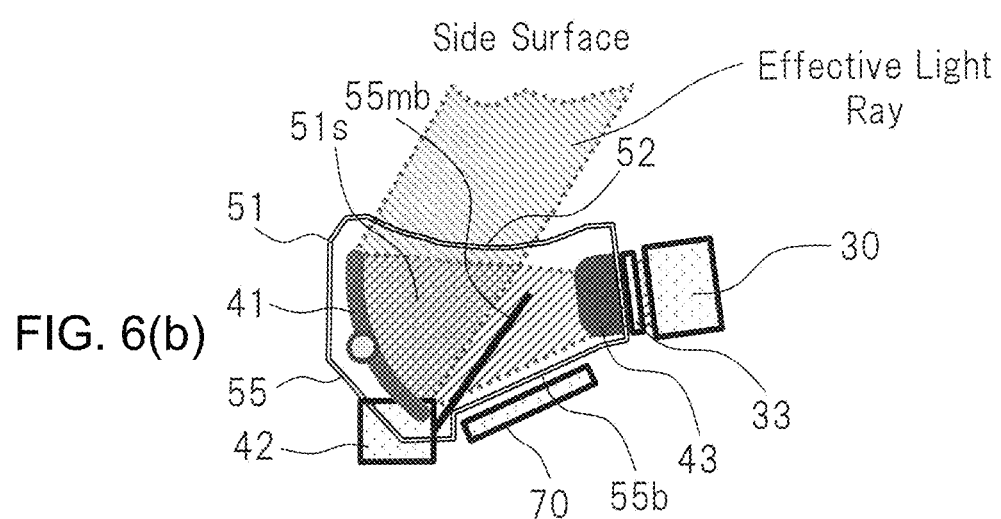

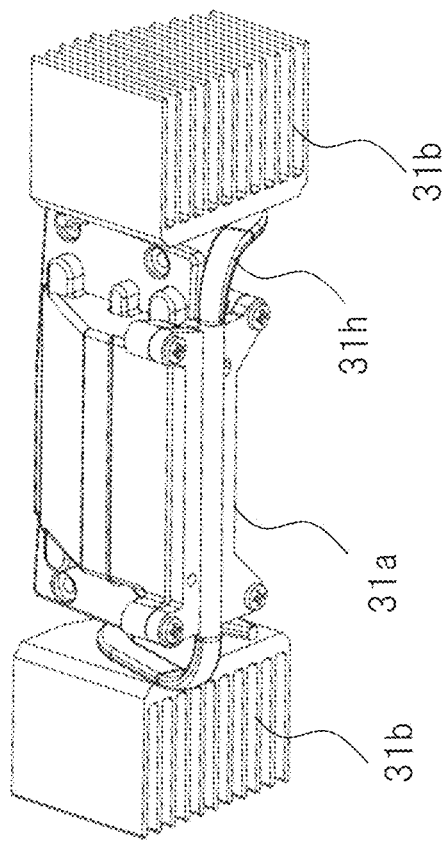
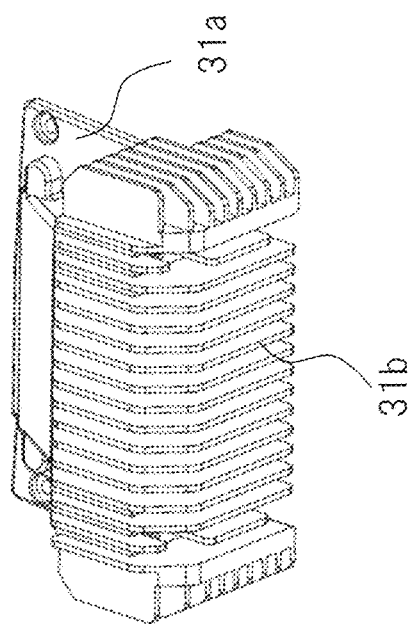
FIG. 11(a)
FIG. 11(b)

VEHICLE

TECHNICAL FIELD

The present invention relates to a head-up display apparatus, and more particularly to a technique to be effectively applied to a head-up display apparatus configured to project an image onto a transparent glass plate or the like.

BACKGROUND ART

For example, for a vehicle such as automotive vehicle, information such as vehicle speed and engine rotation number is typically displayed on an instrument panel in a dashboard. Furthermore, a screen of a vehicle navigation system or the like is incorporated in the dashboard on a display set up on the dashboard. When a driver visually recognizes this information, it is required to move a line of sight largely, and as a technique of reducing a movement amount of the line of slight, a head-up display (hereinafter simply referred to as "HUD" in some cases) which projects and displays information such as vehicle speed and information such as instruction relating to vehicle navigation system on a front glass (windshield) has been known.

As a technique relating to "HUD", for example, JP2015-194707A (Patent Document 1) discloses a display apparatus provided with: a device on which an image is displayed; and a projection optical system for projecting the image displayed on a display device, and in this configuration, a screen distortion is made smaller in the entire viewing-point region of an observer, and a small-size structure is achieved. In this case, the projection optical system is provided with a first mirror and a second mirror in this order in an optical path from the display device to the observer. Furthermore, it discloses that by designing a relationship among an incident angle in an image long axis direction in the first mirror, an incident angle in an image short axis direction in the first mirror, a distance between an image display surface of the display device and the first mirror, and a width in the horizontal direction of a virtual image recognized by the observer so that they satisfy a predetermined relationship, it becomes possible to achieve a HUD apparatus reduced in size.

RELATED ART DOCUMENTS

Patent Documents

Patent Document 1: Japanese Patent Application Laid-Open Publication No. 2015-194707

SUMMARY OF THE INVENTION

Problems to be Solved by the Invention

In the conventional technique disclosed in Patent Document 1, although this apparatus tends to be somewhat reduced in size, this reduction in size is limited. That is, in the technique described in Patent Document 1, two mirrors need to be installed between an observer and a display apparatus. In this configuration, in order to prevent reflected light flux by the first mirror from being shielded by the second mirror, the possibility in layout of mirrors tends is limited. That is, there is a regulation necessary to closely dispose two mirrors, and these mirrors need to be disposed with a certain degree of clearance, and this clearance makes it difficult to carry out the reduction in size of this configuration, and in particular, and encounters a problem in reduction in capacity of the entire apparatus including a housing.

Therefore, an object of the present invention is to provide a head-up display apparatus further reduced in size.

The above and another objects and new features of the invention will be made clearer in this specification with reference to accompanying drawings.

Means for Solving the Problems

Among inventions disclosed in the present application, the following description will briefly discuss an outline of a typical example thereof.

According to one typical embodiment of the present invention, there is provided a head-up display apparatus in which, by projecting an image onto a windshield or a combiner of a vehicle, a virtual image relating to the image is displayed for a driver, and which comprises: an image display apparatus including a light source provided with heat dissipating means and a display element, and generating an image to be displayed on the display element; a virtual image optical system configured to reflect the light emitted from the image display apparatus onto a windshield so that a virtual image is displayed in the front side of the vehicle; and a housing having a wall formed along an effective optical path region of the light of the image.

Effects of the Invention

Among inventions disclosed in the present application, the following description will briefly discuss advantageous effects obtained by the typical embodiment thereof.

That is, according to the typical embodiment of the present invention, it is possible to provide a head-up display apparatus further reduced in size.

BRIEF DESCRIPTION OF THE DRAWINGS

FIGS. 6(a) to 6(c) are bottom, side, and rear views showing the entire housing including the outer case in the head-up display apparatus according to the first embodiment of the present invention;

FIGS. 11 (a) and 11 (b) are views specifically showing an example of an assembling mode of an LED light source and a heat sink serving as its heat dissipating member according to the first embodiment of the present invention;

DESCRIPTION OF PREFERRED EMBODIMENTS

Figure 1:
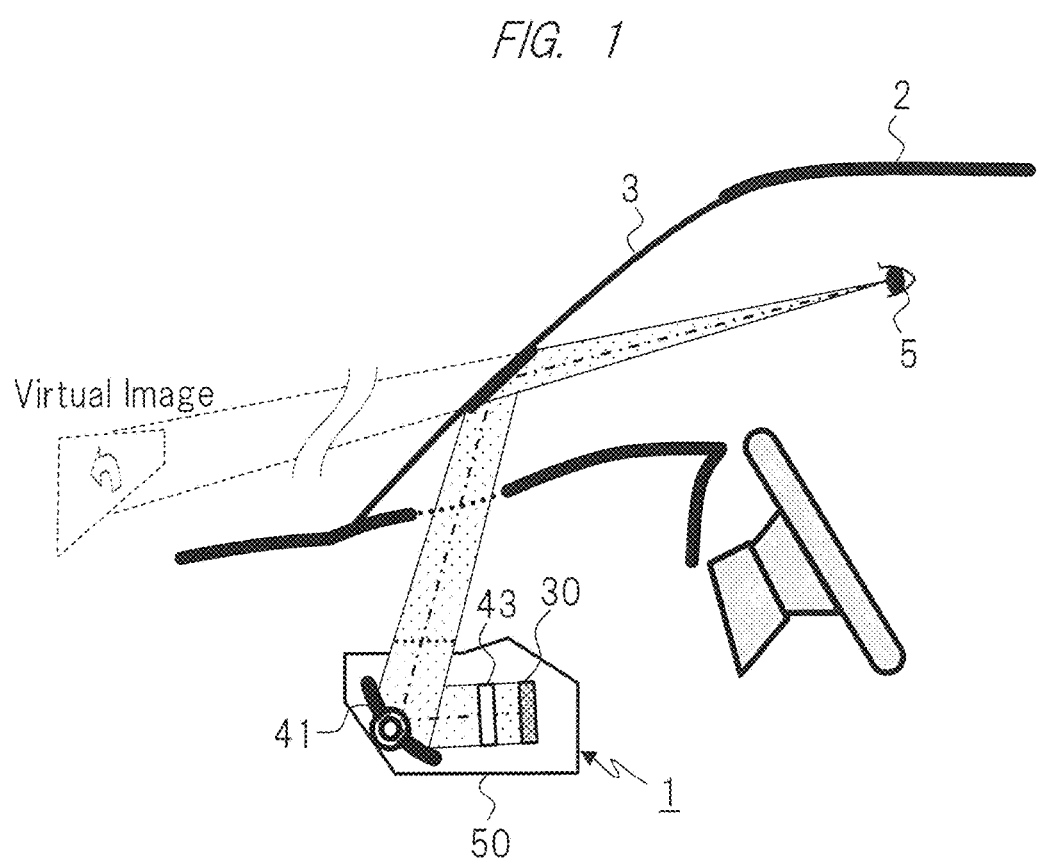
FIG. 1 is a view showing an outline of an example of an operation concept of a head-up display apparatus according to a first embodiment of the present invention.

Hereinafter, embodiments of the present invention will be described in detail in accordance with the drawings. Note that the same components are denoted by the same reference characters throughout the drawings for describing the embodiments in principle, and the repetitive description thereof is omitted. Meanwhile, illustration of a portion which has been denoted by a reference character and described in a figure is not repeated in describing another figure, but the portion may be referred to by denoting the same reference character. Furthermore, in the following embodiments, description will be given by one example of the head-up display (HUD) apparatus to be installed in a vehicle such as an automotive vehicle; however, it may be applicable to another vehicle, such as an electric train, an airplane or the like. Furthermore, it may be applicable to an HUD apparatus other than that equipped on a vehicle.

First Embodiment

<Outline>

FIG. 1 is a schematic view showing an example of an operation concept of a head-up display apparatus (HUD apparatus) according to the first embodiment of the present invention. In an HUD apparatus 1 of this embodiment, an image displayed by an image display apparatus 30 disposed inside a housing 50 (or a portion detachably attached to the housing 50, as will be described later) is reflected by a convex mirror 41 so as to be projected onto a windshield 3 of a vehicle 2.

In this case, the projection receiving member is not limited by the windshield 3, and another member, such as a combiner or the like, may be used as long as an image is projected onto it. Furthermore, the image display apparatus 30 is constituted by, for example, a projector having a back light, an LCD (Liquid Crystal Display) or the like. A self light emitting type VFD (Vacuum Fluorescent Display) or the like may be used. Such a device as to display an image on a screen by using a projector may be used. For example, this screen may be constituted by a micro lens array in which micro lenses are disposed in a two-dimensional pattern.

The concave mirror 41 is constituted by, for example, a mirror having a freely curved surface, a mirror having an optical-axis asymmetrical shape, or the like. More specifically, in order to reduce the distortion of a virtual image, the shape of the concave mirror 41 is designed to make its curvature radius relatively smaller so as to make its magnification factor greater, for example, in a region of its upper portion (that is, in this case, since the reflected light ray is reflected at a lower portion of the windshield 3, the distance to the view point of a driver 5 becomes relatively shorter). On the other hand, in a region of its lower portion of the concave mirror 41 (that is, in this case, since the reflected light ray is reflected at an upper portion of the windshield 3, the distance to the view point of the driver 5 becomes relatively longer) it is designed to make its curvature radius relatively greater so as to make its magnification factor smaller. By disposing the image display apparatus 30 in a manner so as to tilt relative to the optical axis of the concave mirror 41, the above-mentioned difference in image magnification can be corrected so that the generated distortion may be reduced.

When seeing an image projected onto the windshield 3, the driver 5 is allowed to see and recognize the above-mentioned image as a virtual image on the front side through the transparent windshield 3. By adjusting the angle of the concave mirror 41, the position of the image projected onto the windshield 3 is adjusted so that the display position of the virtual image to be seen by the driver 5 may be made adjustable in the vertical direction. Additionally, the contents to be displayed as the virtual image are not particularly limited, and, for example, vehicle information, navigation information, an image of a landscape on the front side, which was taken by a camera (not shown) such as a monitor camera and an around viewer, may be displayed on demand.

In order to enlarge the size of the virtual image to be visually recognized by the driver 5 to a practically used level, since it is necessary to increase the distance from the concave mirror 41 to the virtual image, the dimension of the HUD apparatus 1 is forced to be enlarged. Furthermore, since the windshield 3 to which an image is projected is normally disposed so as to be tilted in a front-rear direction from the same side as the driver 5, it becomes difficult to match image magnifications between an upper portion and a lower portion of the virtual image.

In contrast, in the conventional technique disclosed in the Patent Document 1, in addition to the concave mirror 41, an optical path return mirror is installed between the driver 5 and a display apparatus (image display apparatus 30 in this embodiment) so that the optical path difference in regions having partially different image magnifications is made smaller. In this manner, while maintaining the distance from the concave mirror 41 to the virtual image, the partial change (distortion in an image) in image magnifications can be reduced, and the apparatus can be reduced in volume.

On the other hand, since the two mirrors, that is, the concave mirror 41 and the optical path return mirror are required, the possibility in layout of mirrors is limited, and since it is necessary to keep a certain distance between these mirrors, it is encounters a problem that the reduction in size of this apparatus is limited by this configuration. Furthermore, the Patent Document 1 fails to disclose or consider the necessity of correction of aberration that is generated in the virtual image to be visually recognized by the driver 5, and specific solution or the like.

In contrast, in order to further reduce the size of the apparatus, as shown in FIG. 1, in the HUD apparatus 1 of this embodiment is designed such that only the concave mirror 41 is used as a mirror for forming a virtual image. Furthermore, as a transmission-type optical element, for example, a distortion correcting lens 43 is disposed between the driver 5 and the image display apparatus 30, and it has a concave surface (with negative refractive power) as at least one of surfaces thereof. Thus, by reducing the distortion and aberration of a virtual image to be recognized by the driver 5 to a level causing no problem in practical use, while suppressing the HUD apparatus 1 from becoming bulky and complicated, the visual confirmation can be improved. That is, by controlling the releasing direction of a light ray to the concave mirror 41 by the distortion correcting lens 43, the distortion aberration is corrected together with the shape of the concave mirror 41.

Furthermore, in order to further enhance the aberration correcting capability, a plurality of distortion correcting lenses 43 may be installed. Alternatively, by disposing a curved surface mirror in place of the distortion correcting lens 43, the incident position of a light ray to the concave mirror 41 is controlled simultaneously as an optical path returning process, thereby reducing the distortion aberration. In this manner, the optical element optimally designed so as to further improve the aberration correcting capability may be installed between the concave mirror 41 and the image display apparatus 30, and it is needless to say that this does not depart from the technical idea or the scope of the present invention.

Furthermore, as another configuration, by changing the thickness in the optical axis direction of the optical element constituted by the distortion correcting lens 43 or the like, in addition to the aberration correction, the optical distance between the concave mirror 41 and the image display apparatus 30 may be changed so that the display position of the virtual image is continuously changed from its far end toward its near end.

On the other hand, as the cause of deteriorating the image quality of the HUD apparatus 1, it has been known that image light released from the image display apparatus 30 toward the concave mirror 41 is reflected on the surface of the distortion correcting lens 43, returned to the image display apparatus 30, and then again returned to be superimposed on the original image light. For this reason, in this embodiment, for example, a reflection preventive film is formed on each surface of the distortion correcting lens 43 so as to prevent the reflection. Furthermore, with respect to at least either the incident surface or the emission surface in the distortion correcting lens 43, it is preferable to design the distortion correcting lens so as not to allow the reflected light returning to the image display apparatus 30 to be extremely concentrated on one portion thereof. Furthermore, in the image display apparatus 30, by disposing a polarizing plate configured to absorb reflected light from the above-mentioned distortion correcting lens 43, the deterioration of image quality can be reduced.

Embodiment of HUD Apparatus

Figure 2A:
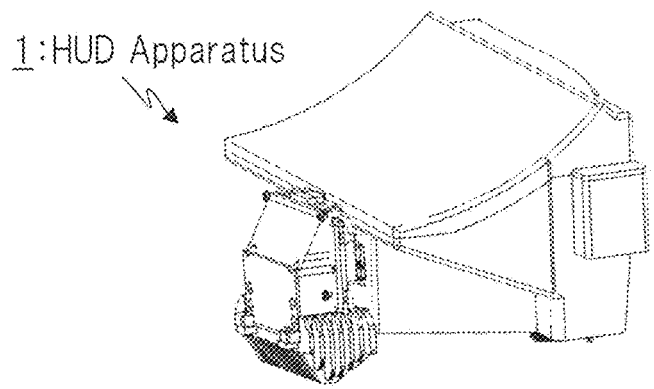
FIGS. 2 (a) and 2 (b) are views showing an outline of an example of an assembling mode of the head-up display apparatus according to the first embodiment of the present invention.

FIGS. 2 (*a*) and 2 (*b*) are views showing an outline of an example of an assembling mode of a head-up display apparatus according to one embodiment of the present invention. FIG. 2 (*a*) is a perspective view showing an example of the HUD apparatus 1 while focusing on an appearance of a housing 50, and FIG. 2 (*b*) is a perspective view showing the HUD apparatus 1 shown in FIG. 2 (*a*) with the HUD apparatus 1 disassembled into parts.

As shown in FIG. 2(*b*), an optical element supporting outer case 55 of the HUD apparatus 1 is a member compatibly provided with a function as an optical element supporting member, the concave mirror 41 and the distortion correcting lens 43 are accommodated in this case, its upper portion is covered with an outer cover 51. The optical element supporting outer case 55 and the outer cover 51 collectively constitute the housing 50 in the HUD apparatus 1 shown in FIG. 1. Furthermore, the image display apparatus 30 is attached to an opening of the optical element supporting outer case 55.

The outer cover 51 has an opening for use in emitting image light toward the windshield 3, and the opening is covered with an antiglare plate 52 (glare trap).

The optical element supporting outer case 55 is a member compatibly has a function for holding the concave mirror 41 and the distortion correcting lens 43 in the HUD apparatus 1 shown in FIG. 1, and although its detailed description will be given later, it is made of a material having characteristics of high heat resistance, high rigidity and high dimensional precision in this embodiment because the member needs to hold the optical elements.

<Housing or Outer Case and Outer Cover>

Figure 3:
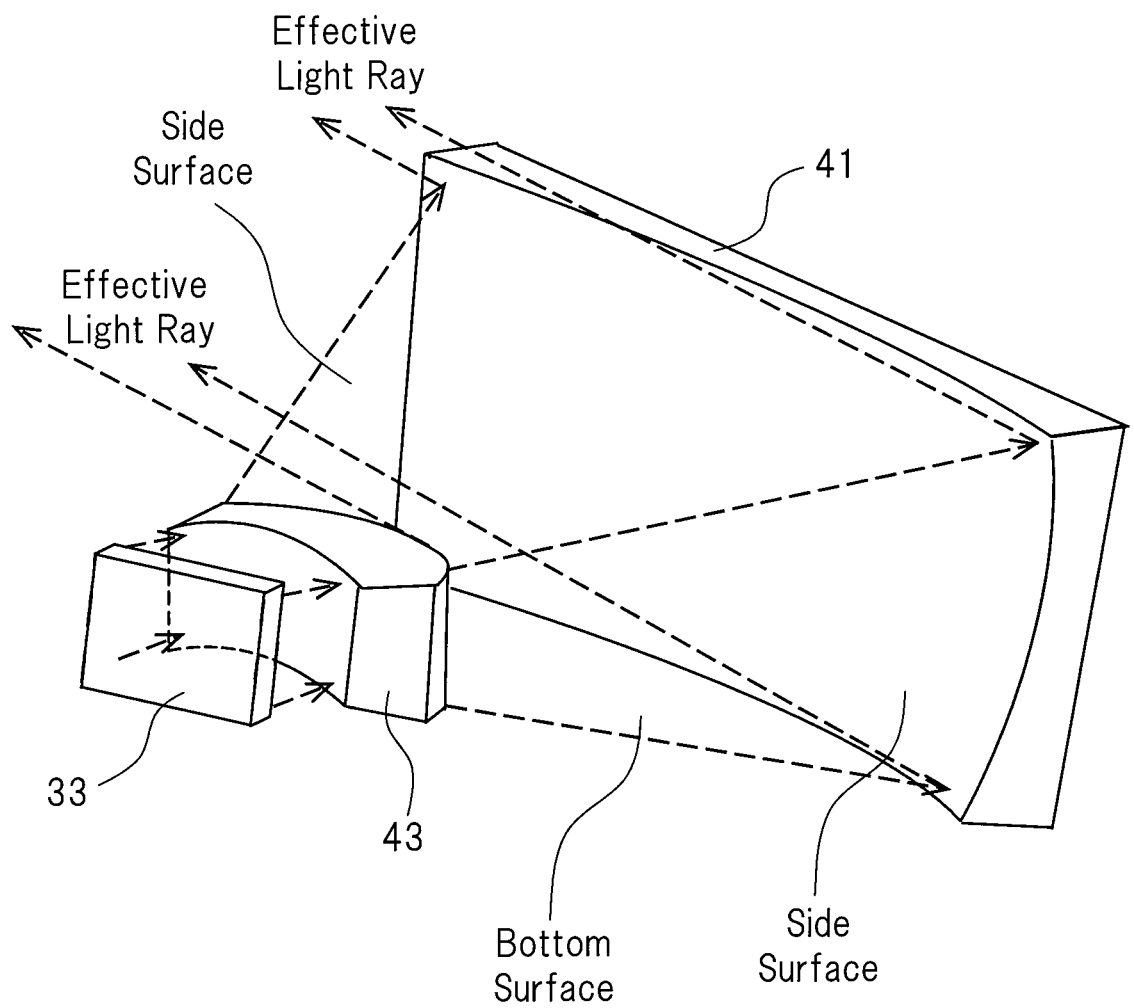
FIG. 3 is an explanatory view of light rays of the head-up display apparatus according to the first embodiment of the present invention.

In this section, in the above-mentioned HUD apparatus 1, attention is focused on the image light emitted from the image display apparatus 30. After the light is emitted from the light source, it is directed to the concave mirror 41 through the distortion correcting lens 43, and is reflected by the concave mirror 41. Furthermore, through the antiglare plate 52 (glare trap) attached to the opening formed on the outer cover 51, the light is released to the outside of the apparatus, that is, toward the windshield 3. At this time, as shown in FIG. 3 also, the image light is emitted, in particular, from the display element (for example, LCD panel) 33 of the image display apparatus 30, and passes through an optical path toward the concave mirror 41, and at this time, it proceeds inside the optical path, with its cross-sectional area being increased or expanded, by the function of the distortion correcting lens 43. Then, it passes through the antiglare plate 52 (glare trap) to proceed toward the windshield 3, while being reflected on the concave mirror 41, with the cross-section of the optical path being changed. Additionally, when there is an obstacle in the middle of the optical path of this type, since one portion or the entire portion of the image projected by the HUD apparatus 1 is lost; therefore, inside the HUD apparatus, it becomes important to maintain an optical path (hereinafter, also referred to as "effective optical path region") through which such an effective light ray (for example, light ray having a predetermined light amount or more, such as 50% or more relative to the maximum light amount) is allowed to pass. However, when a general rectangular-shaped housing that houses the constituent parts, etc. therein and also sufficiently maintains the effective optical path is taken into consideration, the outside dimension of the entire apparatus becomes undesirably bigger, failing to achieve the reduction of the capacity.

Therefore, as described in detail with reference to FIGS. 2 (a) and 2 (b) as well as to the following FIGS. 4 to 6, in the HUD apparatus 1 of this embodiment, the above-mentioned housing 50, in particular, its optical element supporting outer case 55, is designed in the following manner. Additionally, the optical element supporting outer case 55 is formed by physically and functionally combining the optical element supporting member and the outer case into an integral unit. That is, in the optical element supporting outer case 55 having a function as an outer case, the concave mirror 41 and the distortion correcting lens 43 are directly held.

Figure 4A:
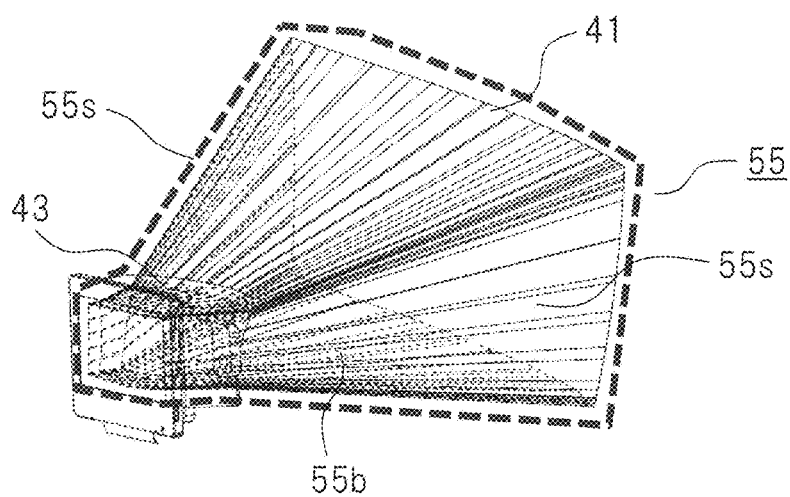
FIGS. 4 (a) to 4 (c) are explanatory views showing a method of forming an outer cover and an outer case constituting a housing in the head-up display apparatus according to the first embodiment of the present invention.
Figure 4B:
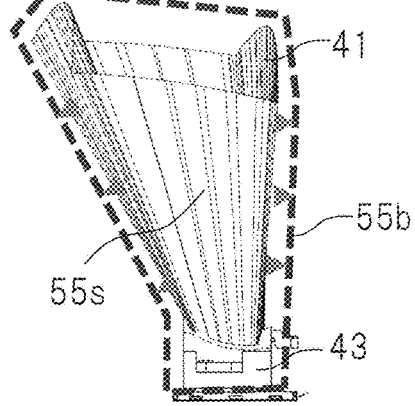
Figure 4C:
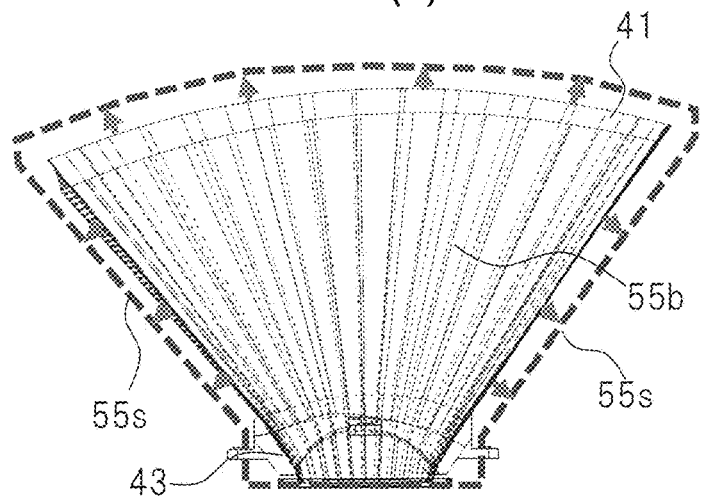
Figure 5:
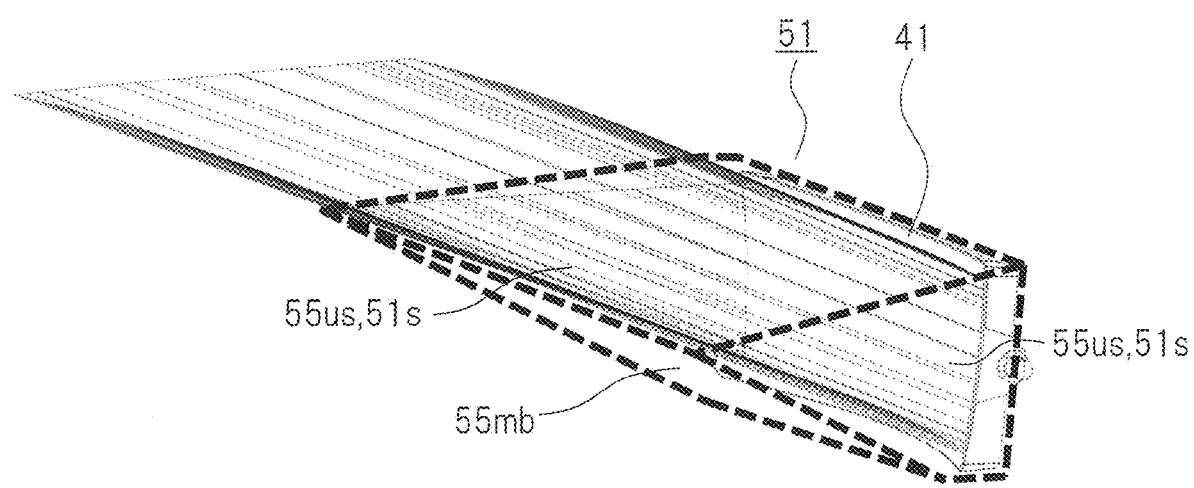
FIG. 5 is an explanatory view showing the method for forming the outer cover and the outer case constituting the above-mentioned housing.

FIGS. 4(a) to 4(c) show an optical path (effective optical path region) of a light ray that is emitted from the display element (LCD panel) 33 of the image display apparatus 30 serving as a light source, and enlarged by the distortion correcting lens 43, and then projected onto the concave mirror 41. Additionally, FIG. 4(a) is a perspective view, FIG. 4(b) is a side face view, and FIG. 4(c) is a top view. Furthermore, FIG. 5 shows an optical path (effective optical path region) of a light ray that is reflected by the above-mentioned concave mirror 41, and released the outside of the housing 50 after passing through the antiglare plate 52 (glare trap).

In this embodiment, as shown by a broken line in FIGS. 4(a) to 4 (c), the optical element supporting outer case 55 is formed so as to over the outside of the effective optical path region together with the concave mirror 41. More specifically, the optical element supporting outer case 55 is formed so as to include: a bottom surface portion 55b having a substantially fan shape; and side surface portions 55s that vertically rise upward from two side ends of the bottom surface portion so as to cover the outside of the effective optical path region from the distortion correcting lens 43 to the concave mirror 41. Furthermore, it also has a shape indicated by a broken line in FIG. 5 in a manner so as to cover the outside of the optical path of the light ray reflected by the concave mirror 41 so as not to intervene with the optical path of the light ray reflected by the concave mirror 41. That is, it has an intermediate bottom surface portion 55mb that is tilted relative to the bottom surface portion 55b (along the lower surface of the region of light ray reflected by the concave mirror 41), and also has a shape in which an upper side surface portion 55us that rises vertically from the intermediate bottom surface portion 55mb and a side surface portion 51s of the outer cover 51 are formed along the side face of the optical path of the light ray reflected by the concave mirror 41. In other words, the upper side surface portion 55us and the side surface portion 51s of the outer cover 51 are formed so as to be flush with each other. Furthermore, in other words, the outer cover 51 and the optical element supporting outer case 55 each forming part of the above-mentioned housing 50 each have a stepped shape as indicated by broken lines in FIGS. 4 and 5. Additionally, in this embodiment, the outer cover 51 and the optical element supporting outer case 55 are integrally assembled, for example, through a fitting process.

Furthermore, a gap formed from the effective optical path region to the bottom surface portion and the side surface portion is preferably set in a range from 1 mm or more to less than 15 mm from the effective optical path region. Additionally, this gap is preferably made uniform along the entire optical path; however, a dimension of this gap in one portion may differ from that of this gap in another portion so as to be non-uniform. That is, it is important to set the outer cover 51 and the bottom surface portion as well as the side surface portions of the outer case 55 forming part of the housing 50 within a range so as not to give adverse effects to an image to be projected.

FIGS. 6(a) to 6(c) are views showing the entire housing including the outer case of the HUD apparatus 1. FIG. 6(a) is a top view, FIG. 6(b) is a side view, and FIG. 6(c) is a rear view. As clearly shown by these drawings, according to the housing 50 constituted by the bottom surface portion 55b, the side surface portion 55s, the intermediate bottom surface portion 55mb, and the upper side surface portion 55us, each of which is formed as described above, the effective light ray of an image light can enter the windshield 3 with a predetermined angle without being shielded inside the HUD apparatus 1.

Furthermore, other parts, such as: a main board 70 on which a controller or the like to be described later is assembled; and a mirror driver 42 constituted by a motor or the like for changing the tilt angle of the concave mirror 41 are detachably attached to the outer peripheral surface of the housing 50 including the optical element supporting outer case 55, for example, by fixing means such as screws or the like. Additionally, in this embodiment, the concave mirror 41 is attached to the inside of the optical element supporting outer case 55 by an optical element supporting member 53, and to one portion of the outer case 55, an opening or the like for use in attaching the image display apparatus 30 is also formed. Thus, the apparatus is fixed to the outer peripheral surface of the outer case 55 by a detachably attaching mechanism such as screws or the like, and easily detachable from it.

Furthermore, the main board 70 is fixed to an outer peripheral surface of the bottom wall of the optical element supporting outer case 55, and the mirror driver constituted by a motor or the like is also fixed to one portion of the outer peripheral surface of the bottom of the outer case 55, and these are also fixed by a detachably attaching mechanism such as screws. Additionally, the HUD apparatus 1 attached with necessary parts are fixed and attached to a position that makes a predetermined angle relative to the windshield (front glass) 3 inside the dashboard in a vehicle compartment. Furthermore, other necessary parts may be attached to the outer peripheral surface of the housing 50 including the optical element supporting outer case 55 and the outer cover 51.

In this embodiment, the image display apparatus 30 is modularized, and integrally detachably attached with screws or the like onto the outside of the above-mentioned optical element supporting outer case 55. Therefore, for example, without removing or disassembling the HUD apparatus 1, only the image display apparatus 30 can be exchanged; thus, it becomes possible to greatly improve the exchangeability of the image display apparatus 30 made of fragile members. Furthermore, by designing the image display apparatus 30 so as to be attached to the outside of the housing 50 of the HUD apparatus 1, its externally heat dissipating performance can be improved, thereby making it possible to obtain such effects as to reduce the frequency of failure and deterioration due to heat.

Furthermore, according to the above-mentioned optical element supporting outer case 55 and the outer cover 51, it is possible to improve the sealability of the effective optical path region serving as the optical path of an effective light ray formed inside thereof. Thus, it differs from the conventional structure in that: dust or the like in the air are hardly adhered to the surface of an optical element, such as the return mirror or the concave mirror, and high optical performance can be maintained for a long period of time. Furthermore, by providing an arrangement for attaching respective necessary parts to the outside of the outer case 54, the entire HUD apparatus 1 can be further reduced in capacity so that attaching work into the dashboard and also exchanging work for a broken element or the like can be easily carried out.

Figure 21A:
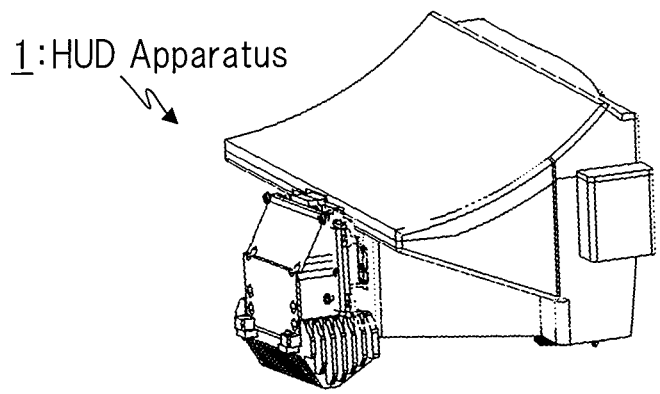
FIGS. 21 (a) and 21 (b) are views showing an outline of an example of an assembling mode of a head-up display apparatus according to a second embodiment of the present invention.
Figure 21B:
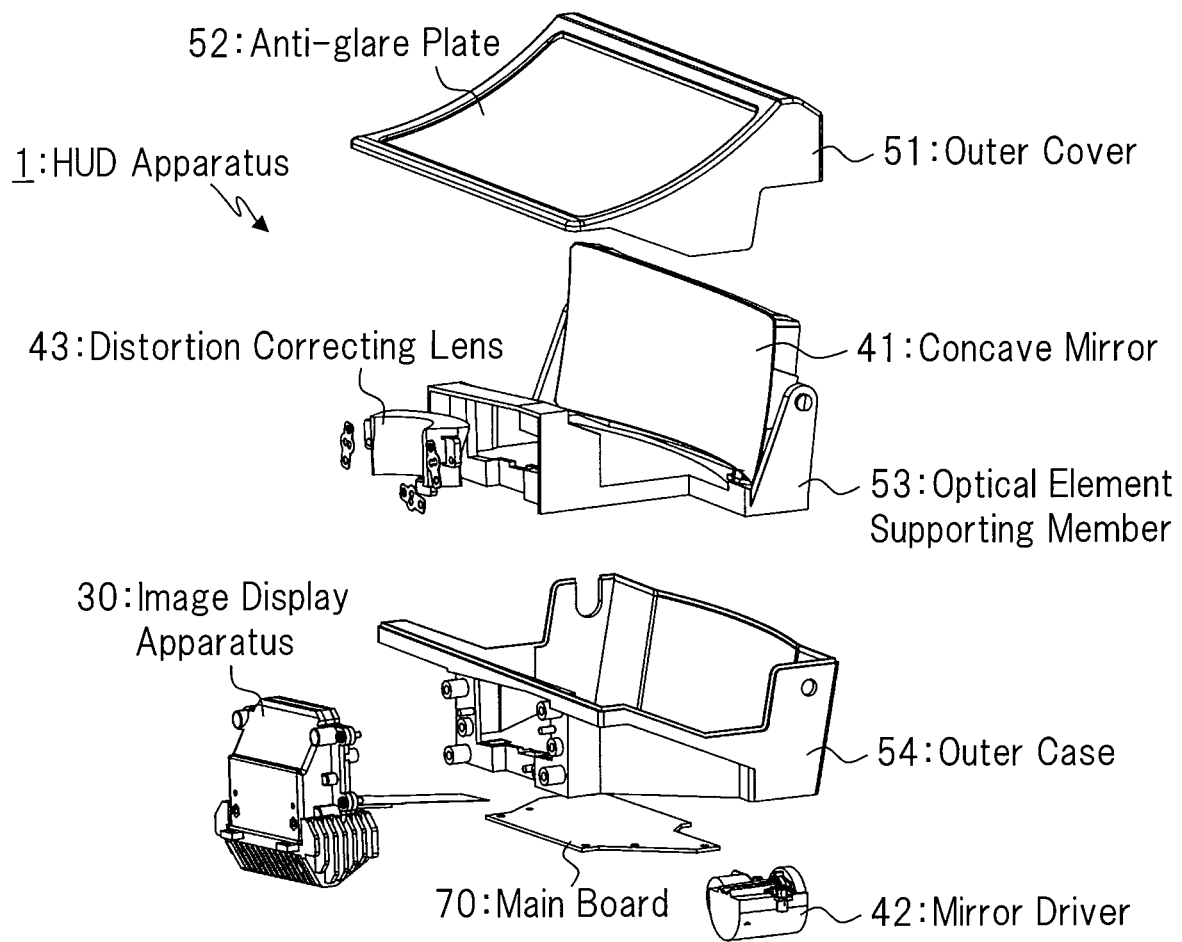

In addition, for example, as shown in FIG. 21(*b*), when the concave mirror 41 and the distortion correcting lens 43 are respectively held on two ends of an individual optical element supporting member 53, the shape of the optical element supporting member 53 seen from the side face is schematically shown as a concave shape (shape of the letter "C"). For example, in the optical element supporting member 53 shown in FIG. 21(*b*), supposing that the side face has a wall shape, the optical element supporting member 53 is designed to have not only a function for holding the concave mirror 41 and the distortion correcting lens 43, but also a function as the outer case housing these members, that is, to serve as the optical element supporting outer case 55 of the present first embodiment. By providing the optical element supporting outer case 55, the HUD apparatus 1 can be further reduced in size.

Furthermore, in this embodiment, as described earlier, the configuration of a direct optical system using no optical path return mirror is adopted. Therefore, such a method used in the conventional technique, in which, for example, by using a cold mirror (mirror for reflecting only visible light while transmitting infrared rays) as the optical path return mirror, the temperature rise inside the housing 50 is suppressed, cannot be adopted. For this reason, for example, an optical member, such as a heat insulating film or the like for cutting or reflecting infrared rays, may be installed on the antiglare plate 52 (emission surface side of image light) and on the front side (emission surface side of image light) of the distortion correcting lens 43, or on the front side (emission surface side of image light) of the image display apparatus 30 (LCD panel). As another means for suppressing the temperature rise, for example, a polarizing plate that transmits an "S" wave perpendicular to the incident surface and does not transmit a "P" wave in parallel with the incident surface may be used. The position at which the polarizing plate is disposed may be set to the front side (emission surface side of image light) of the distortion correcting lens 43. Furthermore, by disposing the polarizing plate on the front side of the distortion correcting lens 43, it is possible to alleviate light (sun light) that is made incident from the sun from returning to the eyes of the driver by being reflected by the lens.

Figure 7:
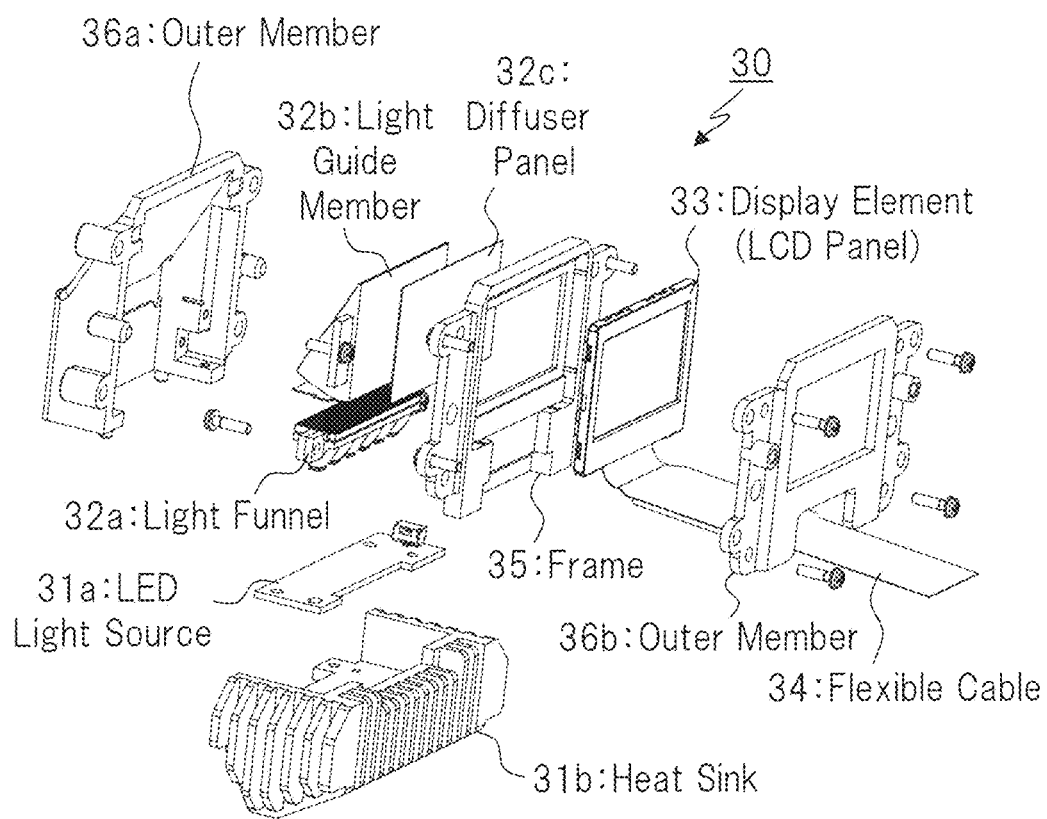
FIG. 7 is a view showing an outline of an example of an assembling mode of an image display apparatus according to the first embodiment of the present invention.

FIG. 7 is a view showing an outline of the assembly example of the image display apparatus 30. Note that this perspective view shows the image display apparatus 30 modularized and disassembled into parts. The image display apparatus 30 displays an image by allowing the display element 33 of the LCD panel or the like to modulate light from a backlight on the basis of image signals inputted from the main board 70 through a flexible cable 34. The displayed image is outputted to a virtual image optical system (in this embodiment, the distortion correcting lens 43 and the concave mirror 41 in FIGS. 2 (*a*) and 2 (*b*) through the opening of the optical element supporting outer case 55 in FIGS. 2(*a*) and 2(*b*) so that a virtual image recognizable by the driver 5 can be generated.

As the light source element in the backlight, for example, an LED (Light Emitting Diode) light source 31*a*, which is comparatively inexpensive and has high reliability as a solid-state light source, is used. The LED light source 31*a* of a surface light-emission type is used for obtaining a high output. In the example of FIG. 7, it is packaged as an LED substrate. In this case, for example, by using a devised technique to be described later, it is possible to improve the utilization efficiency of diverging light.

The light emitting efficiency of the LED to the input power is about 20 to 30%, although it differs depending on light emission color, and almost all the remaining portions are converted to heat. For this reason, a frame 35 to which the LED light source 31*a* is attached is formed with fins (heat sink 31*b*) configured to externally dissipate heat made of a member having high heat conductivity (for example, metal such as aluminum or the like), thereby improving an effect for improving the light emission efficiency of the LED light source 31*a*. In particular, in the LED having a red color as its light emission color and widely available in the market at present, the light emission efficiency is greatly lowered when its junction temperature becomes higher, and the chromaticity of image is simultaneously changed. Therefore, in order to preferentially reduce the temperature of the LED light source 31*a*, the heat dissipating fins in the heat sink 31*b* is made wider so that an arrangement having high cooling efficiency is desirably utilized.

In order to efficiently direct diverging light from the LED light source 31*a* to the display element 33, a light guide body 32*b* is used in an example shown in FIG. 7. In this case, in order to keep dust or the like off of, for example, all parts of the light guide body 32*b*, the display element 33 and the like are preferably covered with outer members 36*a* and 36*b* so as to be modularized as the image display apparatus 30.

Furthermore, in the example of FIG. 7, in order to receive the diverging light from the LED light source 31*a* to form parallel light, a plurality of light funnels 32*a* made of collimating lens or the like are installed. In each of the light funnels 32*a*, an opening for receiving the diverging light from the LED light source 31*a*, for example, a flat surface is provided with a medium that is inserted and optically connected to the LED light source 31*a* and each light funnel 32*a*, or a convex surface is provided with a light converging function, thereby collimating the diverging light as much as possible so that the incident angle of light to be made incident on the interface of the light funnel 32*a* is made as small as possible. As a result, after passing through the light funnel 32*a*, it is possible to control the divergence angle can be made further smaller so that the light source light reflected by the light guide body 32*b* and directed to the display element 33.

Furthermore, by further improving the usage efficiency of diverging light from the LED light source 31*a*, at a joint portion between the light funnel 32*a* and the light guide body 32*b*, polarization conversion is carried out by using PBS (Polarizing Beam Splitter) so that the conversion is made to a desired polarizing direction, thereby improving the efficiency of an incident light to the display element 33. In this manner, when the polarizing direction of light of the light source is aligned, a material having small birefringence is preferably used for the light guide body 32*b*, and even when a polarized light passes through the display element 33 with its polarization direction rotated, it is possible to prevent an occurrence of a problem such as coloring at the time of displaying it in black and while mode.

In this manner, a light flux of the LED light source 31a reduced in divergence angle is controlled by the light guide body 32b so that reflection is made by the total reflection surface installed on an inclined surface (surface on the same side as the outer member 36a in the example of FIG. 7) of the light guide body 32b. Furthermore, the light flux is diffused by a diffusing plate 32c (diffuser) disposed between the surface (emission surface) opposed to the total reflection surface and the display element 33 in the light guide body 32b, and made incident on the display element 33 (LCD panel). Additionally, in the example of FIG. 7, by disposing the diffusing plate 32c between the light guide body 32b and the display element 33, the light flux from the LED light source 31a is diverged; however, the present invention is not limited by this configuration. In place of the diffusing plate 32c, for example, by forming a minute concavo-convex shape on the emission surface of the light guide body 32b so as to exert a diffusing effect, the same effect may be obtained.

Furthermore, as described earlier, since the above-mentioned image display apparatus 30 has an integrally attached configuration by using screws or the like on the outer peripheral part of the housing 50 including the optical element supporting outer case 55 and the outer cover 51, the heat sink 31b constituting heat dissipating fins of the LED light source 31a is easily made in contact with air outside the external case 55, thereby making it possible to efficiently dissipate heat externally. Furthermore, by disposing the heat sink 31b outside of the housing 50, it becomes unnecessary to form a communicating opening for cooling air on one portion of the housing 50, thereby making it possible to improve the dust preventing property of the inside, and to prevent dew formation of the inside; therefore, it becomes possible to maintain high optical performances for a long period of time.

Figure 8:
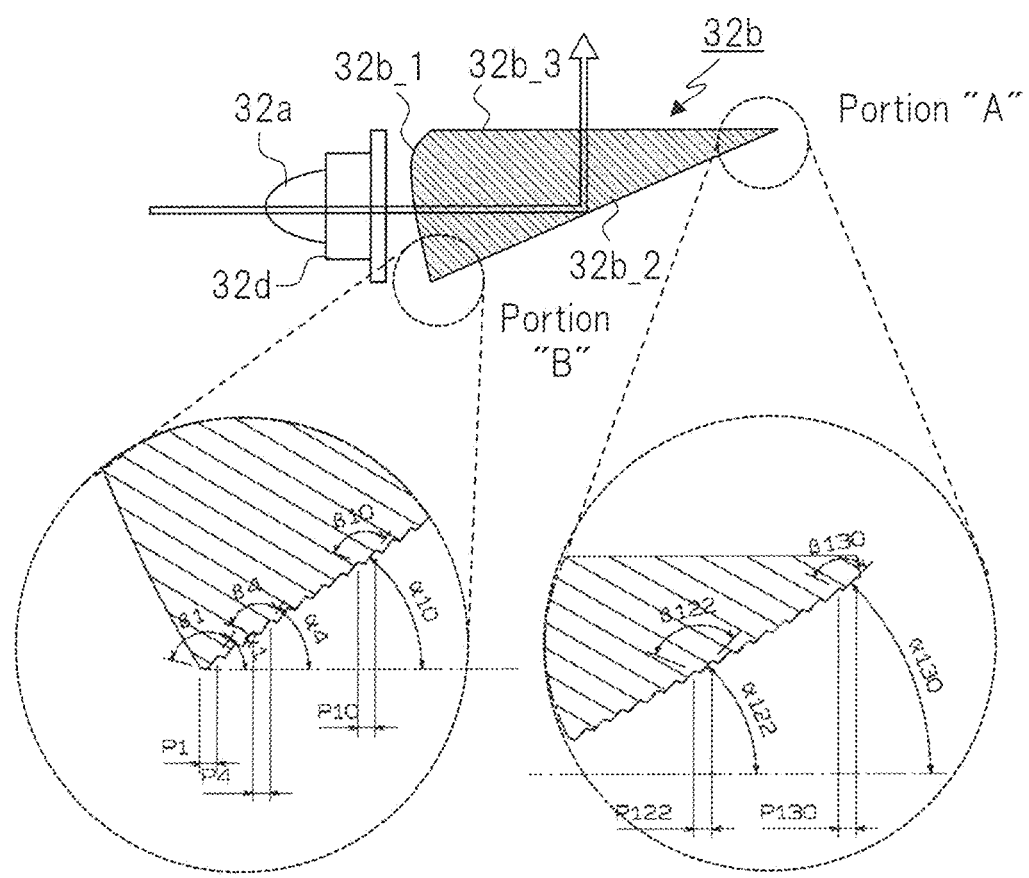
FIG. 8 is a view showing an outline of an example of an assembling mode of a light guide body according to the first embodiment of the present invention.

FIG. 8 is a view showing an outline of an example of an assembling mode of the light guide body 32b, and schematically showing a portion including the light guide body 32b and light funnel 32a. A light flux (arrow in the drawing) reduced in divergence angle by the light funnel 32a is made incident on the incident surface 32b_1 of the light guide body 32b by way of the junction portion 32d. At this time, by the effect of the cross-sectional shape of the incident surface, the divergence angle in the vertical direction (vertical direction in FIG. 8) is controlled so that it is efficiently propagated through the light guide body 32b.

Light of the light source, entered from the incident surface 32b_1, is totally reflected by a total reflection prism installed on an opposing surface 32b_2, and proceeds toward an emission surface 32b_3. The total reflection prism has two portions (see enlarged views) different in shape from each other, and respectively disposed in the vicinity (portion "B" in the drawing) of the incident surface 32b_1 and in the vicinity (portion "A" in the drawing) of the emission surface 32b_3. That is, each portion is formed into a stepped shape depending on the divergence angle of light flux that is made incident on the respective surfaces, thereby controlling the angle of the total reflection to the opposing surface 32b_2. On the other hand, with respect to light flux emitted from the emission surface 32b_3 and made incident on the display element 33 on the succeeding stage, in order to make the light amount distribution inside the emission surface 32b_3 uniform, the arrival position of a reflected and divided light flux and the energy amount thereof are controlled by using the dimension of the above-mentioned division on the opposing surface 32b_2 as a variable.

Figure 9A:
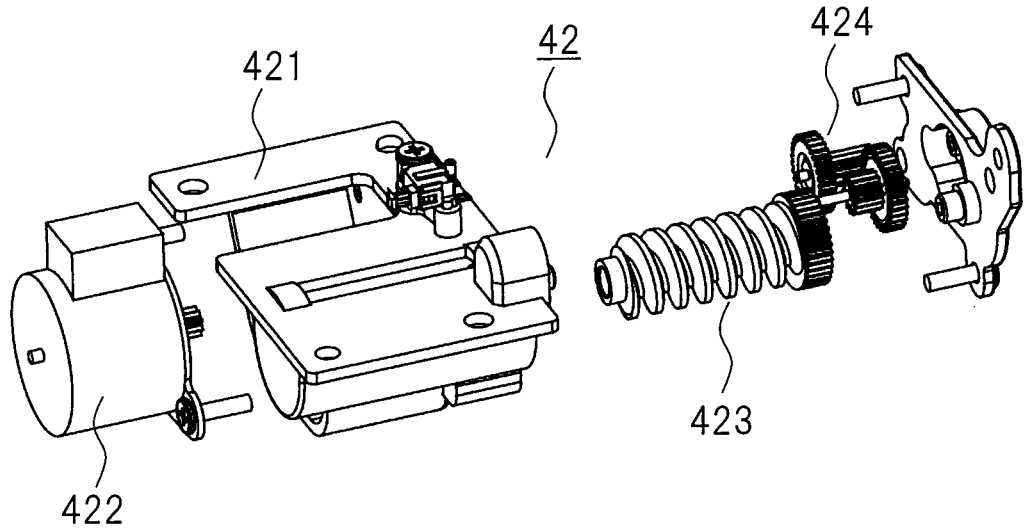
FIGS. 9 (a) and 9 (b) are views specifically showing an example of an assembling mode of a mirror driver according to the first embodiment of the present invention.
Figure 9B:
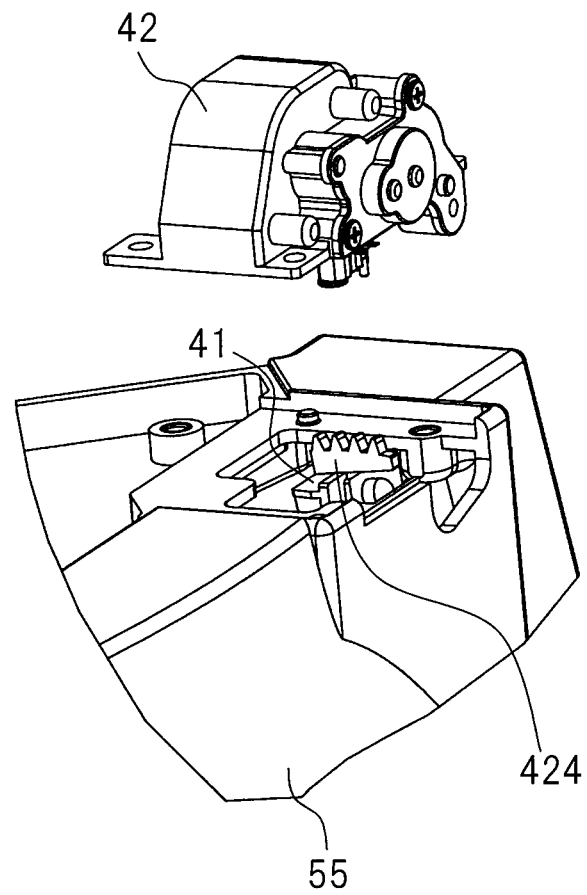

FIGS. 9(*a*) and 9(*b*) are views each showing an outline of an assembly example of a mirror driver 42 configured to change the tilt angle of the concave mirror 41. In this drawing, as shown in FIG. 9(*a*) also, in a case 421, the mirror driver is provided with: at least one electric motor 422, a worm gear 423, and a plurality of gears 424 that are combined with one another between the output shaft of the motor and the worm gear. As shown in FIG. 9 (*b*) also, the mirror driver 42 is attached to the outer peripheral part of the housing 50, more specifically, to the lower end of the optical element supporting outer case 55 so that the worm gear 423 is meshed with a worm wheel 411 provided to the lower end of the concave mirror 41, through a partial cut-out part.

Figure 10:
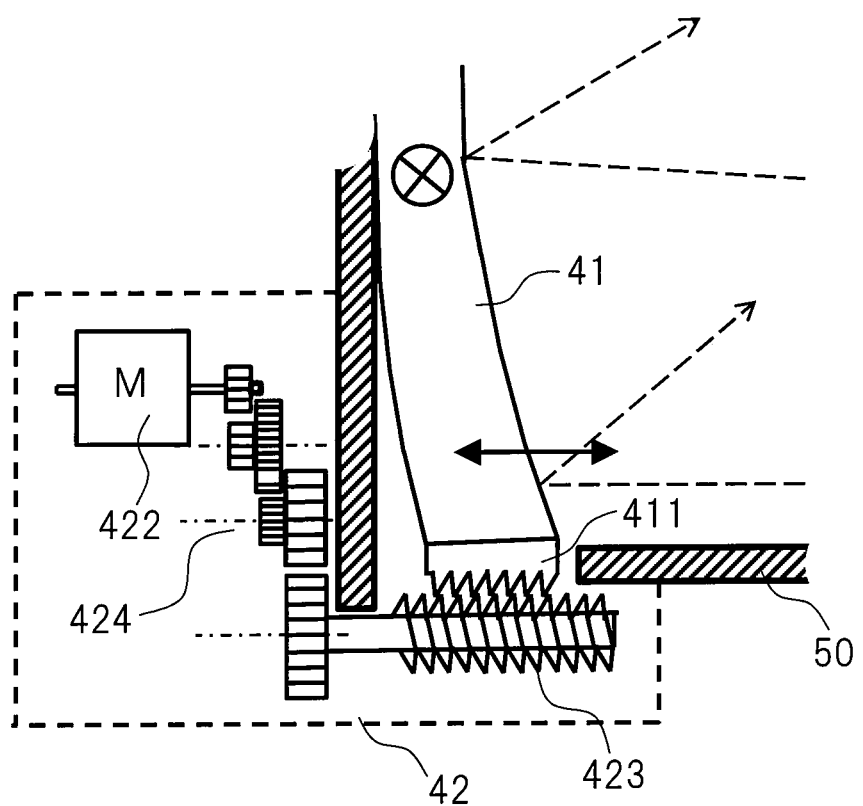
FIG. 10 is a view explaining an operation principle of the above-mentioned mirror driver.

According to the configuration of the above-mentioned mirror driver 42, as shown in FIG. 10 also, the rotation of the electric motor 422 is converted to as to have a desired driving force through the plural gears 424, and transmitted to the worm gear 423 to allow the concave mirror 41 to move in the forward to rearward direction (see an arrow of the drawing) while rotating it about the rotation shaft by the worm wheel 424 formed on the lower end of the concave mirror, so that the concave mirror 41 can be adjusted at a desired tilt angle. Additionally, note that, in this drawing, in order to show this structure in an easy-to-understand manner, the gears 424 are depicted with gaps; however, in fact, it is easily understood by the person skilled in the art that these are meshed with one another.

FIGS. 11(*a*) and 11(*b*) are views each showing an outline of an assembly example of the LED light source 31a and the heat sink 31b forming fins serving as heat dissipating members. Note that FIG. 11(*a*) shows one example in which the heat sinks 31b are integrally attached along the long side of the LED light source 31a that is a heat generating element, and FIG. 11(*b*) shows another example in which the heat sinks 31b are respectively attached to the short sides of the LED light source 31a. In this manner, by providing a configuration capable of setting on demand the attachment position of the heat dissipating fins for the LED light source 31a, in particular, as in the case of this embodiment, it becomes possible to set the attachment position of the heat sink 31b to the housing 50 at desired positions that make the dimension (capacity) of the apparatus minimum on demand, thereby making it possible to reduce the size of the apparatus, and also to broaden its design possibility.

Figure 12:
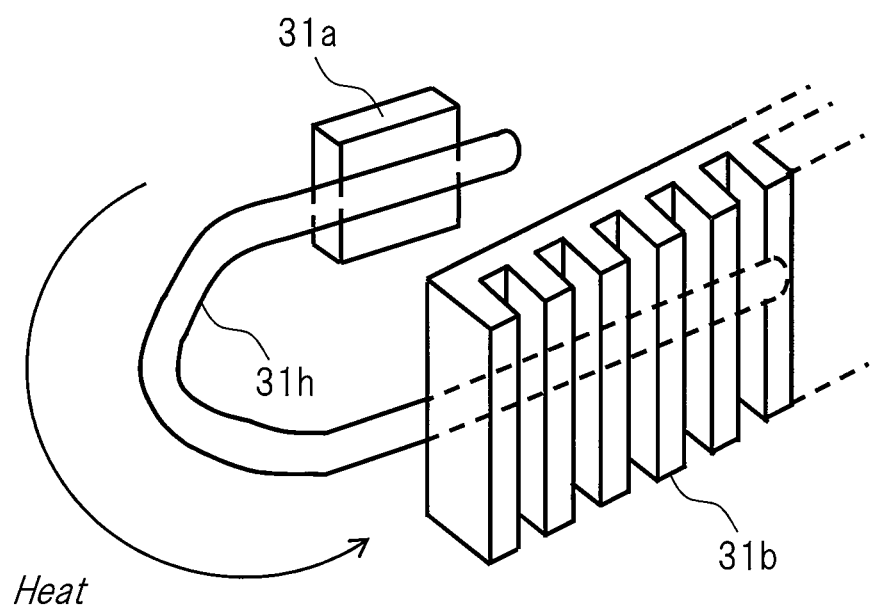
FIG. 12 is a view explaining an operation principle of the above-mentioned heat sink.

Additionally, if a large gap is formed between the heat sink 31b and the LED light source 31a that is a heat generating element, as shown in FIG. 12, a so-called heat pipe 31h serving as a heat transmitting member is desirably installed so as to intervene between them. In this manner, since heat of the LED light source 31a is transmitted to the heat sink 31b (see an arrow in the drawing), it becomes possible to realize effective heat dissipation.

<Functional Configuration of HUD Apparatus>

Figure 13:
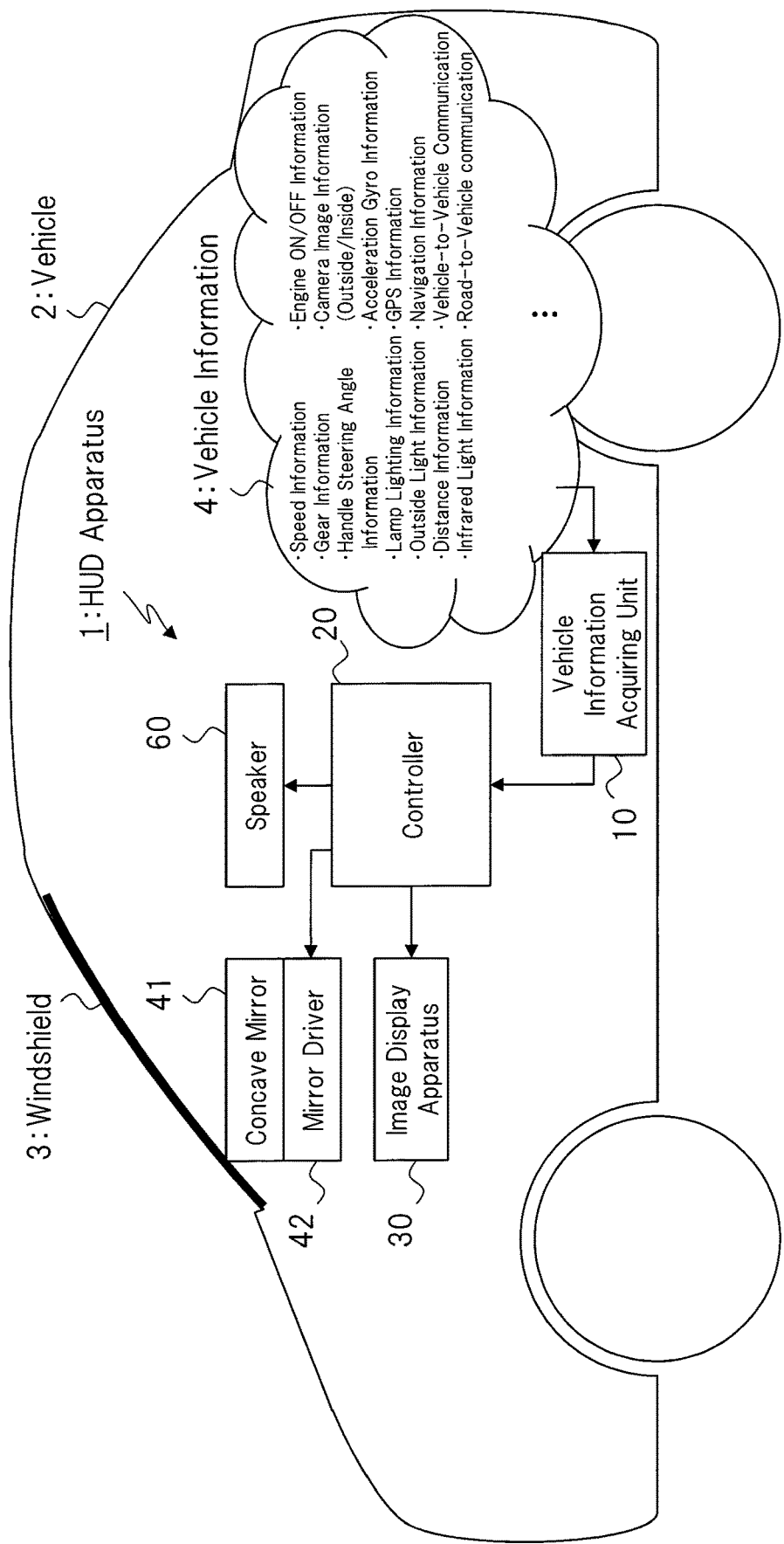
FIG. 13 is a functional block diagram showing an outline of the entire structural example of a head-up display apparatus according to the first embodiment of the present invention.

FIG. 13 is a functional block diagram showing an outline of a structural example of the entire head-up display apparatus of the first embodiment of the present invention. The HUD apparatus 1 to be mounted on the vehicle 2 is constituted by, for example, including a vehicle information acquiring unit 10, a controller 20, the image display apparatus 30, the concave mirror 41, the mirror driver 42, a speaker 60, etc. Additionally, in the example of FIG. 13, the shape of the vehicle 2 is shown as automotive vehicle; however, not limited by this example, the present invention may be generally applied to any vehicles on demand.

The vehicle information acquiring unit 10 is constituted by information acquiring devices, such as various sensors and the like as will be described later, which are installed on respective parts in the vehicle 2, and configured to detect various events generated in the vehicle 2, and to detect and acquire values of various parameters relating to driving states in a predetermined interval so that vehicle information 4 is acquired and outputted. As shown, the vehicle information 4 includes, for example, speed information and gear information of the vehicle 2, handle steering angle information, lamp lighting information, external light information, distance information, infrared ray information, engine ON/OFF information, camera image information (inside/outside the vehicle), acceleration gyro information, GPS (Global Positioning System) information, navigation information, vehicle-to-vehicle communication information, and road-to-vehicle communication information, etc.

The controller 20 has a function for controlling operations of the HUD apparatus 1, and is packaged by, for example, CPU (Central Processing Unit) and software to be executed by the CPU. This may be packaged by hardware, such as a microcomputer or an FPGA (Field Programmable Gate Array), etc. As shown in FIG. 1, the controller 20 forms an image to be displayed as a virtual image by driving the image display apparatus 30 on the basis of the vehicle information 4 or the like acquired by the vehicle information acquiring unit 10, and by reflecting this image by the concave mirror 41, the resulting image is projected onto the windshield 3.

As described above, the image display apparatus 30 is a modularized device constituted by, for example, including a projector and an LCD, and configured to form an image for use in displaying a virtual image on the basis of an instruction from the controller 20 so as to project or display the image. The mirror driver 42 is configured to adjust the angle of the concave mirror 41 on the basis of an instruction from the controller 20, and to further adjust the position of the display region of the virtual image in the vertical direction. The speaker 60 carries out a sound output relating to the HUD apparatus 1. For example, this can carry out "voice guidance" for a navigation system and a voice output or the like at the time of giving information, such as a warning or the like, to the driver 5.

Figure 14:
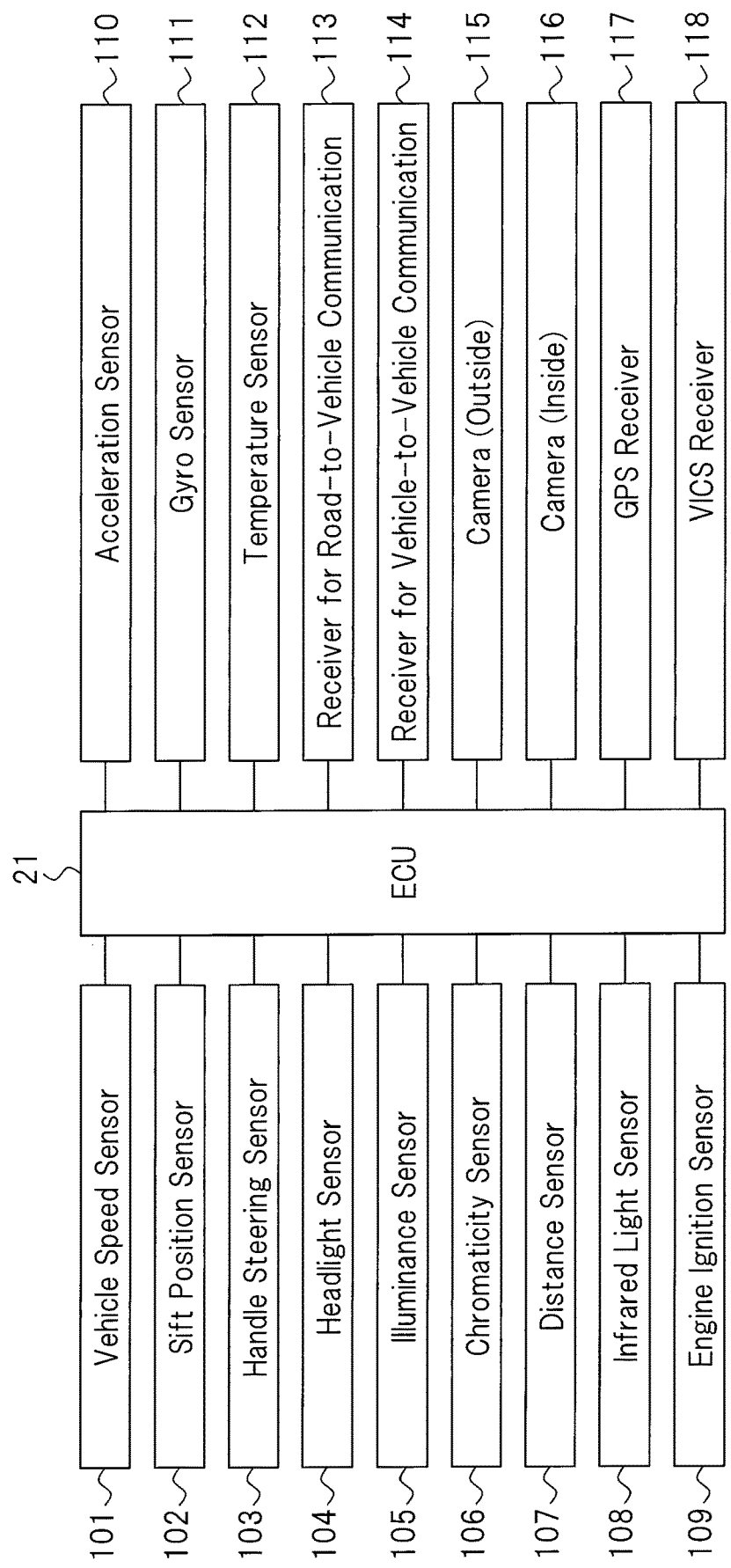
FIG. 14 is a view showing an outline of an example of a hardware configuration relating to an acquiring process of vehicle information according to the first embodiment of the present invention.

FIG. 14 is a view showing an outline of an example of a hardware configuration relating to the acquisition of vehicle information 4 in the head-up display apparatus of this embodiment. In this case, the hardware configuration of one portion of the vehicle information acquiring unit 10 and the controller 20 is mainly shown. The acquisition of the vehicle information 4 is carried out by an information acquiring device, such as various sensors or the like connected to an ECU (Electronic Control Unit) 21 under control of the ECU 21.

These information acquiring devices, for example, include various devices, such as a vehicle speed sensor 101, a shift position sensor 102, a handle steering angle sensor 103, a headlight sensor 104, an illuminance sensor 105, a chromaticity sensor 106, a ranging sensor 107, an infrared ray sensor 108, an engine starting sensor 109, an acceleration sensor 110, a gyro sensor 111, a temperature sensor 112, a road-to-vehicle communication radio receiver 113, a vehicle-to-vehicle communication radio receiver 114, a camera (inside the vehicle) 115, a camera (outside the vehicle) 116, a GPS receiver 117, a VICS (Vehicle Information and Communication System: Road Traffic Information Communication System, Registered Trademark (the same applies hereafter)) receiver 118, and the like. The present invention is not necessarily provided with all of these devices, and furthermore, may be provided with other kinds of devices. The vehicle information 4 acquired by installed devices can be used on demand.

The vehicle speed sensor 101 is configured to acquire speed information of the vehicle 2. The shift position sensor 102 is configured to acquire gear information at present of the vehicle 2. The handle steering angle sensor 103 is configured to acquire handle steering angle information. The headlight sensor 104 is configured to acquire lamp lighting information relating to ON/OFF of the headlight. The illuminance sensor 105 and the chromaticity sensor 106 are configured to acquire external light information. The ranging sensor 107 is configured to acquire distance information between the vehicle 2 and an external object. The infrared ray sensor 108 is configured to acquire infrared ray information relating to the presence/absence of an object and distance or the like in a close distance of the vehicle 2. The engine starting sensor 109 is configured to detect engine ON/OFF information.

The acceleration sensor 110 and the gyro sensor 111 are configured to acquire acceleration gyro information composed of acceleration and angular velocity as information of the attitude and behavior of the vehicle 2. The temperature sensor 112 is configured to acquire temperature information of the inside and outside of the vehicle. The road-to-vehicle communication radio receiver 113 and the vehicle-to-vehicle communication radio receiver 114 are configured to respectively acquire road-to-vehicle communication information received by road-to-vehicle communication between the vehicle 2 and a road, a road sign, a signal or the like and vehicle-to-vehicle communication information received by vehicle-to-vehicle communication between the vehicle 2 and another vehicle around it.

The camera (inside the vehicle) 115 and the camera (outside the vehicle) 116 respectively photograph motion images showing situations inside and outside of the vehicle, and obtain camera image information (inside/outside the vehicle). In the camera (inside the vehicle) 115, for example, attitudes, positions of the eyes, motions, etc. of the driver 5 are photographed. By analyzing the motion images thus obtained, for example, fatigue states, positions of the sight line and the like of the driver 5 can be confirmed. Furthermore, in the camera (outside the vehicle) 116, peripheral states, such as front and rear sides, etc. of the vehicle 2 are photographed. By analyzing the motion images thus obtained, the presence/absence of peripheral moving objects, such as other vehicle and persons, buildings and geographical states, road states (rain, snowfall, freezing states, concave/convex states, etc.) and the like can be confirmed.

The GPS receiver 117 and the VICS receiver 118 are configured to respectively acquire GPS information obtained by receiving GPS signals and VICS information obtained by receiving VICS signals. A vehicle navigation system is configured to acquire and utilizes such information may be partially packaged.

Figure 15:
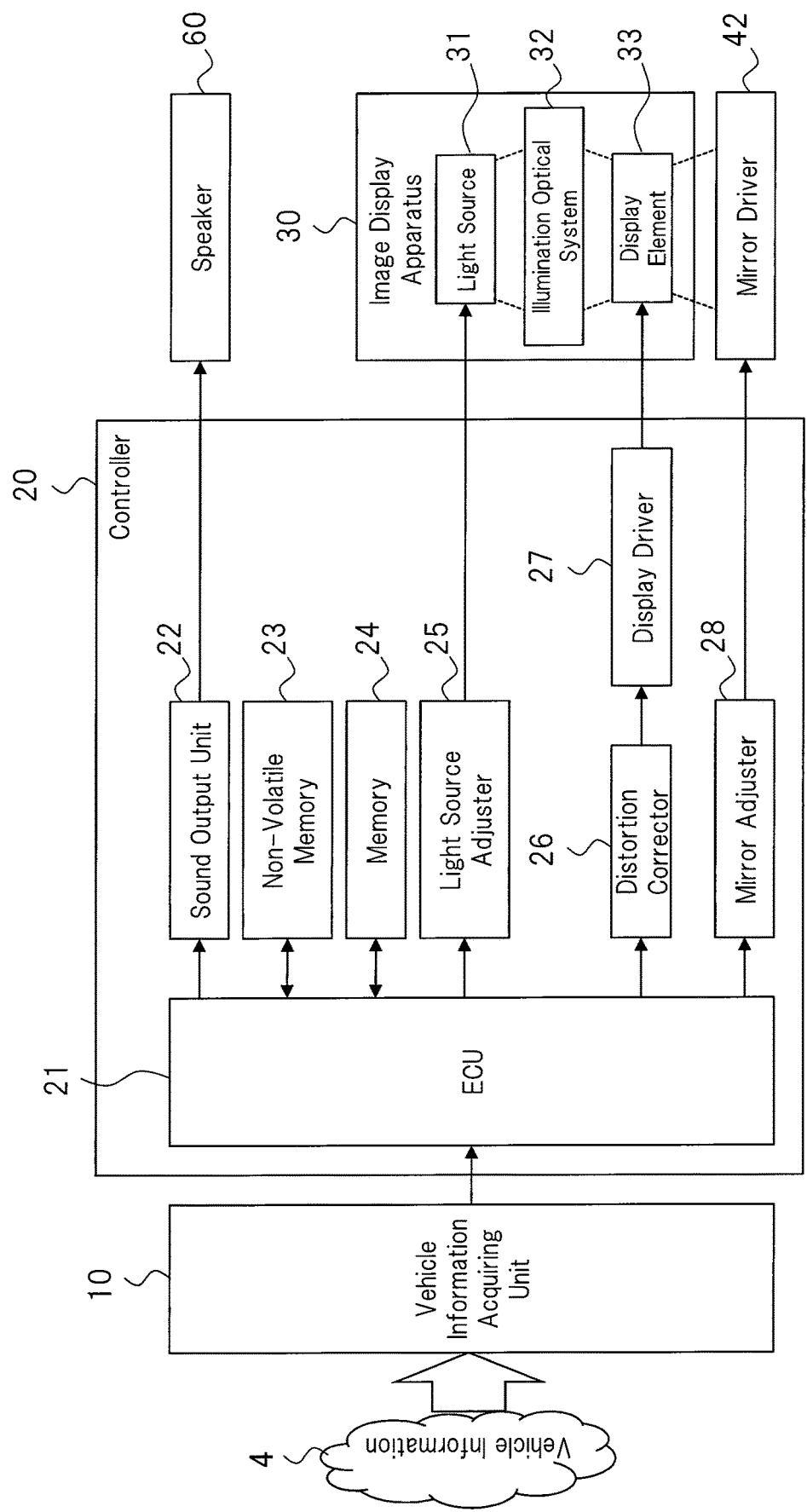
FIG. 15 is a functional block diagram specifically showing a structural example in the first embodiment of the present invention.

FIG. 15 is a functional block diagram specifically showing a structural example of the head-up display apparatus of this embodiment. In the example of FIG. 15, the image display apparatus 30 is prepared as a projector, and the image display apparatus 30 is constituted by parts such as, for example, a light source 31, an illumination optical system 32 and a display element 33.

The light source 31 is a member configured to generate illumination light for use in projection so as to form a backlight, and for example, a high-pressure mercury lamp, a xenon lamp, an LED light source, a laser light source or the like may be utilized. A solid-state light source having a long product service life is desirably adopted. For example, polarization conversion is desirably carried out by using PBS in which an optical means for reducing the divergence angle of light is installed on the LED light source having less change in optical output relative to the peripheral temperature change. In this embodiment, as shown in FIG. 5, the light source 31 is constituted by an LED light source 31a and a heat sink 31b. The light source 31 is disposed or controlled so as to allow the incident direction of light relative to the display element 33 to be described later to be efficiently made incident on the incident pupil of the concave mirror 41.

The illumination optical system 32 is an optical system in which by converging illumination light generated by the light source 31 to be more uniformed, the resulting light is projected to the display element 33. As shown in FIG. 7, the illumination optical system 32 is constituted by a light funnel 32a, a light guide body 32b and a diffusion plate 32c in this embodiment.

The display element 33, which is an element configured to generate an image to be projected, may be formed by using, for example, a transmission-type liquid crystal panel, a reflection-type liquid crystal panel, a DMD (Digital Micromirror Device) (registered trademark) panel or the like. On the light incident surface (that is, the light source 31 and the illumination optical system 32 side) as well as on the light emission surface (that is, distortion correcting lens 43 and concave mirror 41 side) of the display element 33, polarizing plates are desirably disposed respectively so as to increase the contrast ratio of image light. As the polarizing plate to be installed on the light incident surface, by using such an iodine-based plate having a high polarizing degree, it is possible to obtain a high contrast ratio. On the other hand, as the polarizing plate to be installed on the light emission surface, by using a dye-based plate, it is possible to obtain high reliability even when external light is made incident thereon or when the environmental temperature is high.

When a LCD panel is used as the display element 33, in particular when the driver 5 wears polarizing sunglasses, a problem arises in that specific polarizing waves are shield, with the result that the image cannot be seen. In order to prevent this problem, by further disposing a λ/4 plate in front of the polarizing plate disposed on the light emission surface of the LCD panel (that is, on the same side as the distortion correcting lens 43 and the concave mirror 41), image light aligned in a specific polarizing direction is desirably converted into circularly polarized light.

The controller 20 is more specifically provided with an ECU 21, a sound output unit 22, a nonvolatile memory 23, a memory 24, a light source adjuster 25, a distortion corrector 26, a display element driver 27 and a mirror adjuster 28, etc.

As shown in FIG. 15, the ECU 21 is configured to acquire vehicle information 4 through the vehicle information acquiring unit 10, and to record, store or read out the acquired information to or from the nonvolatile memory 23 and the memory 24, if necessary. In the nonvolatile memory 23, setting information, such as setting values, parameters and the like for use in various controls, may be stored. Furthermore, the ECU 21 generates image data relating to a virtual image to be displayed as the HUD apparatus 1, by executing a dedicated program or the like. The sound output unit 22 outputs voice information through a speaker 60, if necessary. The light source adjuster 25 adjusts the light emission amount of the light source 31 of the image display apparatus 30. When a plurality of light sources 31 is installed, these may be individually controlled respectively.

The distortion corrector 26 is configured to correct a distortion caused at the time of projecting the image generated by the ECU 21 to the windshield 3 of the vehicle 2 by the image display apparatus 30, by using an image process. This distortion includes, for example, an image distortion generated by the curvature of the windshield 3, a distortion caused by a minute positional deviation at the time of attaching the module of the image display apparatus 30, or the like. The display element driver 27 is configured to send a driving signal corresponding to image data corrected by the distortion corrector 26 to the display element 33 so as to generate an image to be projected. The mirror adjuster 28 is configured to change the angle of the concave mirror 41 by using the mirror driver 42 when the position of the display region itself of the virtual image needs to be adjusted, and the display region of the virtual image is shifted in the vertical direction.

<Configuration of Virtual Image Optical System>

Figure 16A:
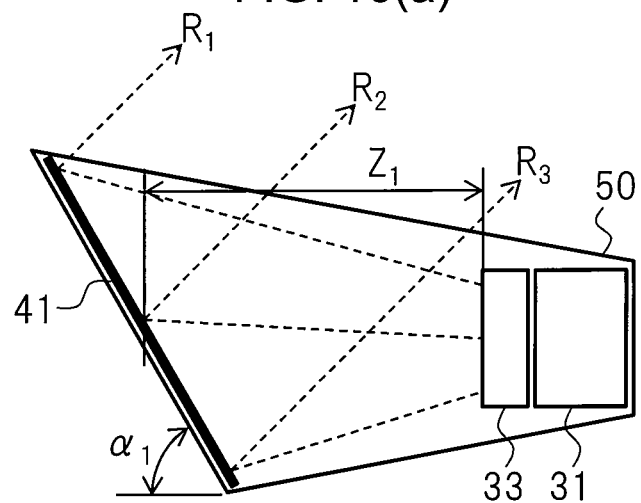
FIGS. 16(a) to 16(c) are views showing an outline of a structural example of an optical system for displaying a virtual image, and reduction in size of the apparatus according to the first embodiment of the present invention.
Figure 16B:
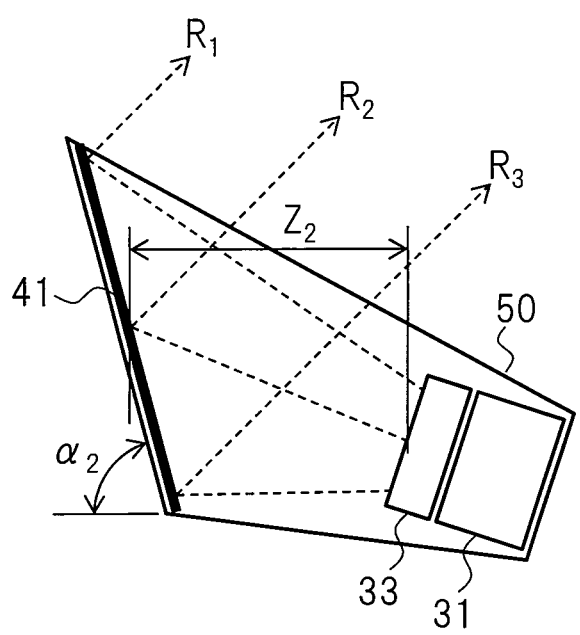
Figure 16C:
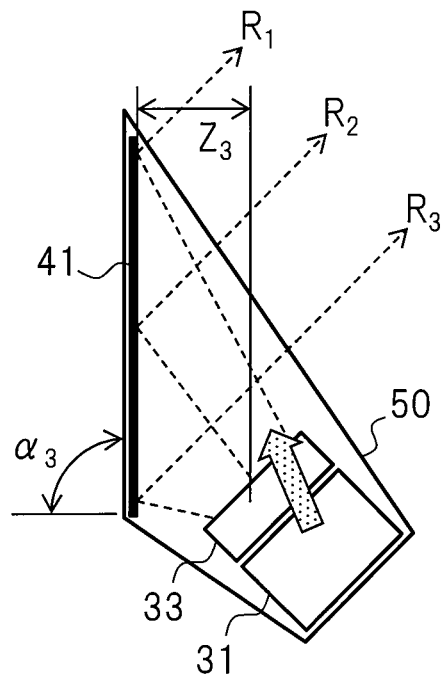

FIGS. 16(a) to 16(c) are views showing an outline of a configuration example of an optical system configured to display a virtual image in the HUD apparatus 1 and the miniaturization of the device. FIG. 16(a) is a view showing an outline of the basic configuration of the virtual image optical system in the HUD apparatus 1, and showing an outline of the shape of a vertical cross section of the HUD apparatus 1. In this figure, for simplicity of explanation, the illustration of a distortion correcting lens 43 configured to correct aberration and distortion aberration is omitted. Furthermore, the concave mirror 41 is briefly indicated as a plane surface mirror.

Furthermore, in the example of FIGS. 16(a) to 16(c), a configuration in which an LCD panel is used as the display element 33 of the image display apparatus 30, and the light source 31 serving as a backlight and the concave mirror 41 are disposed is used as a basic configuration, and this is accommodated in the housing 50. The elements of the basic configuration are disposed so as to allow the image displayed on the display element 33 to be reflected by the concave mirror 41 and recognized as a virtual image. Furthermore, image light rays generated by the upper end, the middle and the lower end of the image on the screen of the display element 33 are indicated by arrows in dot lines as image light rays R1, R2 and R3. In this case, as shown, designing regulation lies in that the respective elements are disposed such that when the respective image light rays are reflected by the concave mirror 41, the image light rays are not shielded by being intervened with the display element 33.

FIGS. 16 (a) to 16 (c) show that, by taking the above-mentioned designing regulation into consideration, distance "Z" in the horizontal direction between each center of the concave mirror 41 and the display element 33 is varied as a parameter. This configuration shows that, as shown, from FIGS. 16(a) to 16(c), the distance "Z" becomes gradually smaller from Z1 toward Z3, and accordingly, the angle made by the concave mirror 41 from the horizontal surface also becomes gradually greater from α1 to α3. In the same manner, the dimension in the vertical direction of the concave mirror 41 also becomes gradually greater.

When the parameter of the distance "Z" is varied, the height and depth of the HUD apparatus 1 (more specifically, the housing 50) are varied in response to this change. That is, as the distance "Z" is made smaller, the height of the HUD apparatus 1 becomes slightly higher, while the depth is greatly reduced, as shown in FIG. 16(c). As a result, by designing such a configuration as to reduce the capacity and also to make the distance "Z" smaller by using the above-mentioned configuration of the outer case 54 and the outer cover 51 constituting the housing 50, the capacity of the HUD apparatus 1 (housing 50) can be further reduced so that the miniaturization is achieved.

On the other hand, when the distance "Z" is made smaller (distance Z3) as shown in FIG. 16(*c*), the difference between the distance (corresponding to the image light ray R1) from the top end of the display element 33 to the top end of the concave mirror 41 and the distance (corresponding to the image light ray R3) from the lower end of the display element 33 to the lower end of the concave mirror 41 becomes greater. That is, when the distance "Z" is made smaller, distortion and aberration of a virtual image generated in the concave mirror 41 become greater, although the capacity of the HUD apparatus 1 can be reduced. In contrast, it is desirable to shift the disposing position of at least the display element 33 or the like in a direction indicated by an arrow mark shown in FIG. 16(*c*) within a range not to intervene with image light rays (in particular, image light ray R3) so that the distance between the display element 33 and the concave mirror 41 can be made uniform as much as possible. In addition, by disposing the light source 31 and the display element 33 so as to be included within the height dimension of the concave mirror 41, the apparatus can be desirably reduced in size without unnecessarily increasing the dimension in the height direction of the housing 50.

Furthermore, in this embodiment, as described above, by disposing the distortion correcting lens 43 configured to correct distortion in a virtual image and aberration generated in the virtual image between the display element 33 and the concave mirror 41, it is possible to correct the distortion and aberration.

Figure 17:
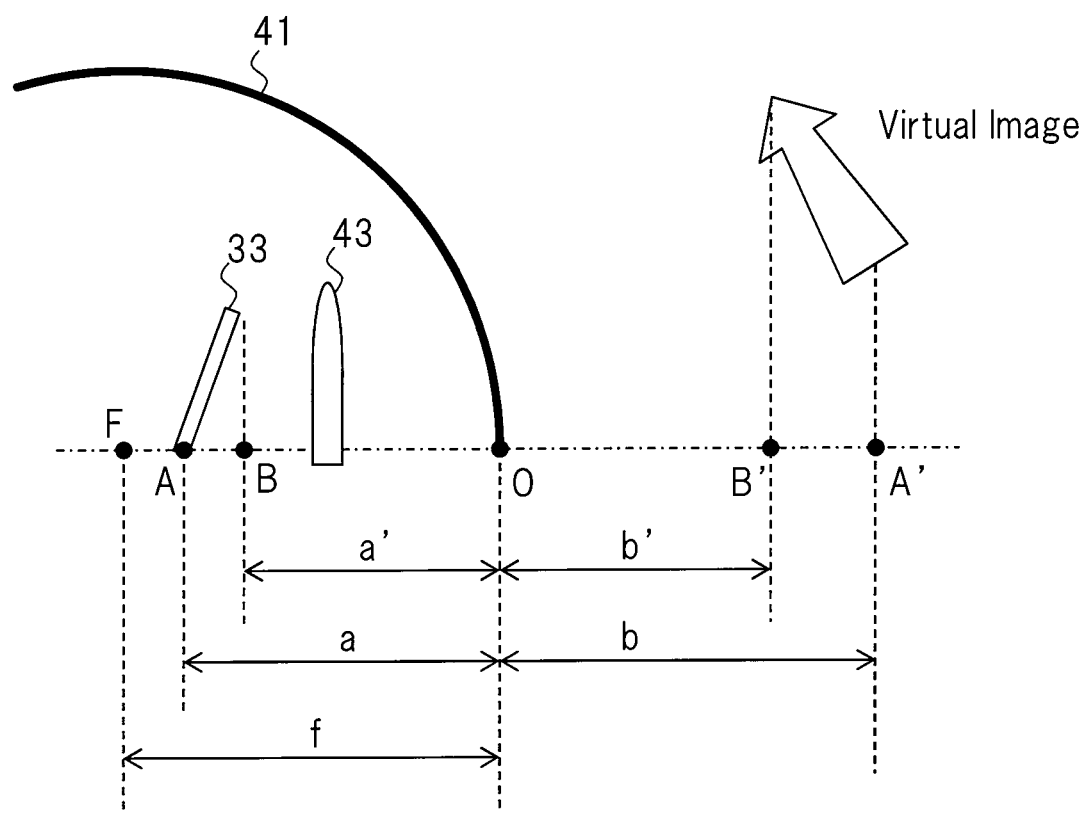
FIG. 17 is a view showing an outline of an example of a correction process of distortion and aberration by a distortion correcting lens in the first embodiment of the present invention.

FIG. 17 is a view showing an outline of an example of correction of the distortion and aberration by the distortion correcting lens 43. As shown, by disposing the display element 33 (object point) inside a focal point "F" (focal point distance "f") relative to a point "O" on the optical axis of the concave mirror 41, a virtual image (denoted as an arrow mark in the drawing) formed by the concave mirror 41 can be obtained. Additionally, for convenience of explanation, in the drawing, by regarding the convex surface mirror 41 as a convex lens having the same positive refracting force, the relationship among the object point, the convex lens (in the drawing, for convenience of explanation, denoted as the concave mirror 41) and a virtual image thus generated is shown.

In this embodiment, as described above, the distortion correcting lens 43 for reducing distortion and aberration generated in the concave mirror 41 is disposed. In this embodiment, the optical element is prepared as a transmission-type optical lens; however, not limited by the lens, it may be a concave mirror. The distortion correcting lens 43 is designed to have the following arrangements:

(1) when image light from the display element 33 is made incident on the reflection surface of the distortion correcting lens 43 as a telecentric light flux, the refractive force of the distortion correcting lens 43 (optical lens or concave mirror) becomes substantially zero;

(2) when image light from the display element 33 is diverged and then made incident on the distortion correcting lens 43, the distortion correcting lens 43 is allowed to have a positive refractive force; and (3) when image light from the display element 33 is converged and then made incident on the distortion correcting lens 43, the distortion correcting lens 43 is allowed to have a negative refractive force. Thus, the direction (angle and position) of a light flux to be made incident on the concave mirror 41 can be controlled. In this manner, distortion aberration of a virtual image generated in the concave mirror 41 can be corrected. Furthermore, when the distortion correcting lens 43 is constituted by a transmission-type optical lens, aberration relating to image-forming performances generated in a virtual image can be corrected by mutual functions by the light incident surface (on the same side as the display element 33) and the light emission surface (on the same side as the concave mirror 41).

At this time, the distance "a" from the display element 33 to the concave mirror 41 and the distance "b" from the concave mirror 41 to a virtual image become different depending on the upper end and the lower end of the virtual image due to the tilt and curvature of the windshield 3, as described earlier. Thus, the image magnification of the virtual image recognized by the driver 5 becomes different depending on the upper end and the lower end.

In contrast, in this embodiment, by tilting the display element 33 relative to the optical axis of the concave mirror 41 as shown in FIG. 17 (not being straight, that is, the optical axis is raised by the lens), the image magnification at the upper end of the virtual image M'=b'/a' and the image magnification at the lower end of the virtual image M=b/a are made substantially coincident with each other. Thus, the distortion aberration caused by a tilt or the like of the windshield 3 can be reduced.

Furthermore, in this embodiment, the average curvature radius of the cross-sectional shape in the vertical direction of the distortion correcting lens 43 and the average curvature radius of the cross-sectional shape in the horizontal direction thereof are further set to values different from each other. Thus, distortion aberration generated by an optical path difference caused by the difference between the curvature radius in the vertical direction of the windshield 3 and the curvature radius in the horizontal direction thereof and aberration that reduces the image-forming performance of a virtual image are corrected. In the case of the HUD apparatus 1 for obtaining a virtual image by directly reflecting image light onto the windshield 3, the correction of aberration generated by an optical path difference caused by the difference between the curvature radius in the vertical direction of the windshield 3 and the curvature radius in the horizontal direction thereof is most important in ensuring the image-forming performance of a virtual image.

More specifically, by using a freely curved surface shape as the shape of the distortion correcting lens 43, the above-mentioned reduction in the image-forming performance of a virtual image due to the difference in the curvature radii of the windshield 3 can be reduced. In the conventional optical designing, an aspherical shape in which the shape of a lens surface and a mirror surface is defined as a function of the distance "r" from the optical axis has been used. The aspherical shape is represented by the following equation.

$$Z = \frac{c \cdot h^2}{1 + \sqrt{1-(1+K)c^2 \cdot h^2}} + A \times h^4 + B \times h^6 + C \times h^8 + D \times h^{10} + E \times h^{12} + F \times h^{14} + G \times h^{16} + H \times h^{18} + J \times h^{20}$$ [Equation 1]

In contrast, in this embodiment, a freely curved shape capable of defining the shape of a plane as a function of the absolute coordinates (x, y) from the optical axis is used. The freely curved shape is represented by the following equation.

$$Z = \frac{c \cdot (x^2 + y^2)}{1 + \sqrt{1 - (1+K)c^2 \cdot (x^2 + y^2)}} +$$
$$\sum \sum (C_j(m, n) \times x^m \times y^n) j = [(m+n)^2 + m + 3n]/2 + 1$$

In this manner, by using the distortion correcting lens 43, with its cross-sectional shape and disposing position being controlled, distortion and aberration of a virtual image generated in the concave mirror 41 can be corrected. However, for this purpose, it is based on the premise that high positioning precision is ensured about the optical members, such as the concave mirror 41 and the distortion correcting lens 43.

With respect to this point, for example, in the HUD apparatus 1 shown in FIG. 2 (*b*), when the members, such as the outer cover 51 and the optical element supporting outer case 55 or the like, forming the housing 50 are formed by using materials having not so high heat resistance, rigidity and dimensional precision, problems are posed. For example, due to influences, such as machining precision and working precision at the time of producing the HUD apparatus 1 or attaching to the vehicle 2, as well as expansion, deformation or the like caused by heat during the use, deviations tend to occur from the designed state in the positional relationship between the concave mirror 41 and the distortion correcting lens 43. As a result, the correction precision for the distortion and aberration caused by the use of the distortion correcting lens 43 is also lowered.

Therefore, in this embodiment, in the configuration of the HUD apparatus 1 shown in FIG. 2(*b*), at least the optical element supporting outer case 55 holding the concave mirror 41 and the correcting lens 43 is made of a material having characteristics of high heat resistance, high rigidity and high dimensional precision. More specifically, for example, a non-saturated polyester resin, such as BMC (Bulk Molding Compound) or the like, polycarbonate containing glass fibers, etc. may be used. In particular, since BMC has a high thermosetting property and can be molded into complicated shapes by using a mold, BMC is also used in this embodiment.

By using the optical element supporting outer case 55 made of the above-mentioned material, the concave mirror 41 and the distortion correcting lens 43 are held so that the positional relationship between the concave mirror 41 and the distortion correcting lens 43 can be maintained with high precision even under hard usage environments such as high temperatures, vibrations or the like in the vehicle 2. Additionally, since the relative positional relationship between the concave mirror 41 and the distortion correcting lens 43 has a complicated twisted relationship three-dimensionally, it is difficult to constitute an integral unit by using only the concave mirror 41 and the distortion correcting lens 43. Therefore, this embodiment has a configuration in which the concave mirror 41 and the distortion correcting lens 43 are held together with each other by using the optical element supporting outer case 55.

Furthermore, even if, as the positional relationship between the concave mirror 41 and the distortion correcting lens 43, they are in the above-mentioned three-dimensionally complicated twisted relationship, the optical element supporting outer case 55 makes it possible to achieve and maintain the positional relationship with high precision. That is, by holding the concave mirror 41 and the distortion correcting lens 43 by the optical holding member 53 that is a single interposed member formed by a material having characteristics of high heat resistance, high rigidity and high dimensional precision, it becomes possible to maintain the relative positional relationship with high precision. Furthermore, in this embodiment, the optical element supporting outer case 55 having the above-mentioned characteristics has its shape also optimized so as to be molded as a single part by a resin metal molding process.

Furthermore, in this embodiment, as described earlier, the image display apparatus 30 is modularized so as to be easily detachably attached. Therefore, the image display apparatus 30 might have a minute positional deviation at the time of assembling; however, this deviation can be corrected and adjusted by image processing or the like in the distortion corrector 26 in the controller 20 shown in FIG. 15.

<Process Contents of HUD Apparatus>

Figure 18:
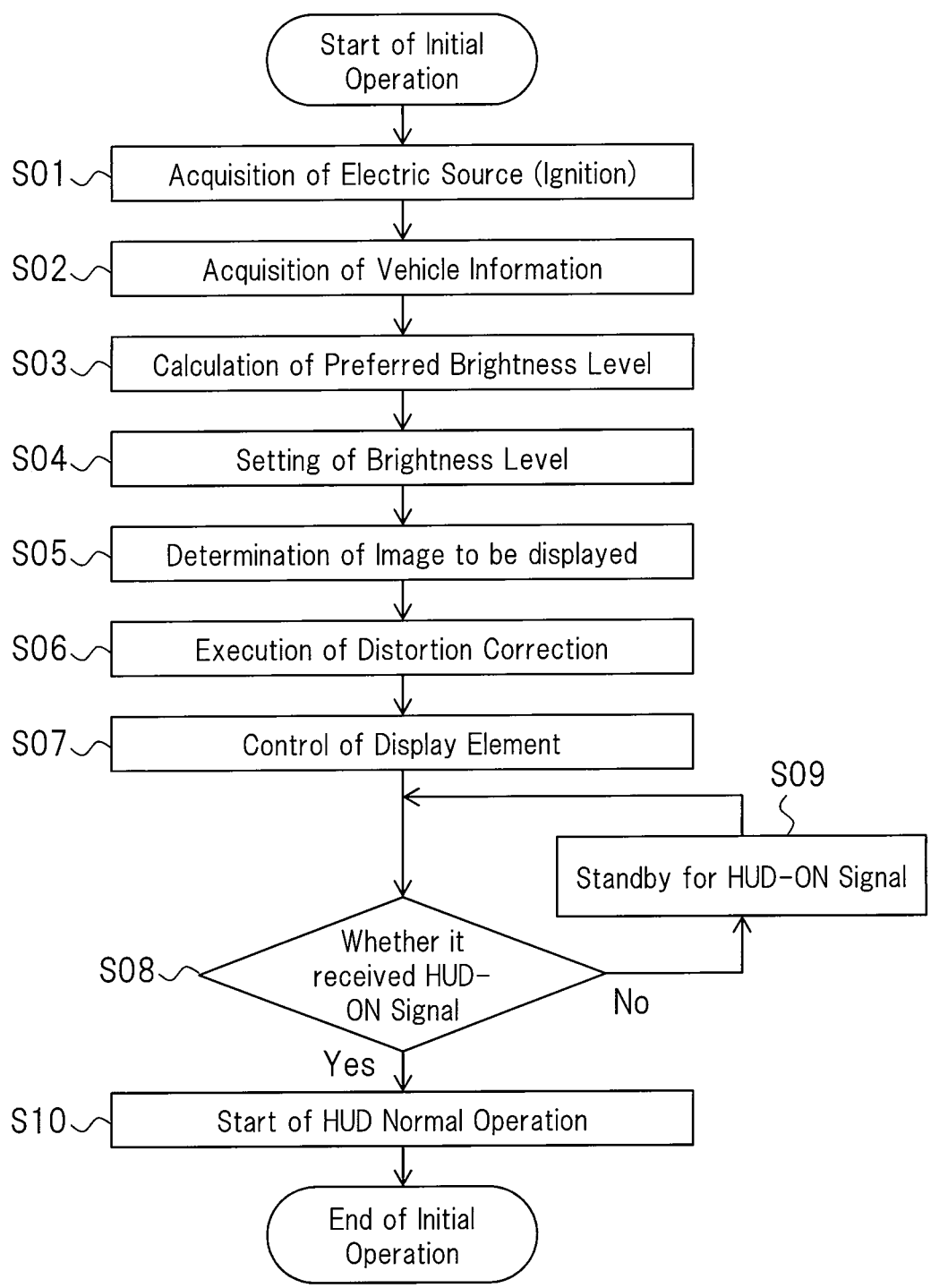
FIG. 18 is a flow chart showing an outline of an example of an initial operation in the first embodiment of the present invention.

FIG. 18 is a flow chart showing an outline of an example of an initial operation of the head-up display apparatus of this embodiment. When the power source of the HUD apparatus 1 is turned ON by turning ON an ignition switch in a vehicle 2 that is in a stopped state (S01), the HUD apparatus 1 first acquires vehicle information by the vehicle information acquiring unit 10 on the basis of an instruction from the controller 20 (S02). Then, on the basis of external light information acquired by the illumination sensor 105, the chromaticity sensor 106 and the like, of the vehicle information 4, the controller 20 calculates a suitable brightness level (S03), and has the light source adjuster 25 control the light emission amount of the light source 31 so that it satisfy the calculated brightness level (S04). For example, when the external light is bright, the brightness level is set to high, and on the other hand, when it is dark, the brightness level is set to low.

Subsequently, an image (for example, initial image) to be displayed as a virtual image is determined and generated by the ECU 21 (S05), and after the process for correcting distortion is executed on the generated image by the distortion corrector 26 (S06), the display element driver 27 drives and controls the display element 33 so as to form an image to be projected (S07). In this manner, the image is projected onto the windshield 3 so that the driver 5 is allowed to recognize the virtual image.

In the entire HUD apparatus 1, upon completion of activating and starting process including the above-mentioned sequence of initial operation, an HUD-ON signal is outputted, and the controller 20 determines whether this signal is received (S08). When this signal is not received, it continues to wait for the HUD-ON signal for a predetermined period of time (S09), and repeats the waiting process for the HUD-ON signal (S09) until it is determined that the HUD-ON signal is received in step S08. When it is determined that the HUD-ON signal is received in step S08, normal operation of the HUD apparatus 1 described later starts (S10), the sequence of initial operation ends.

Figure 19:
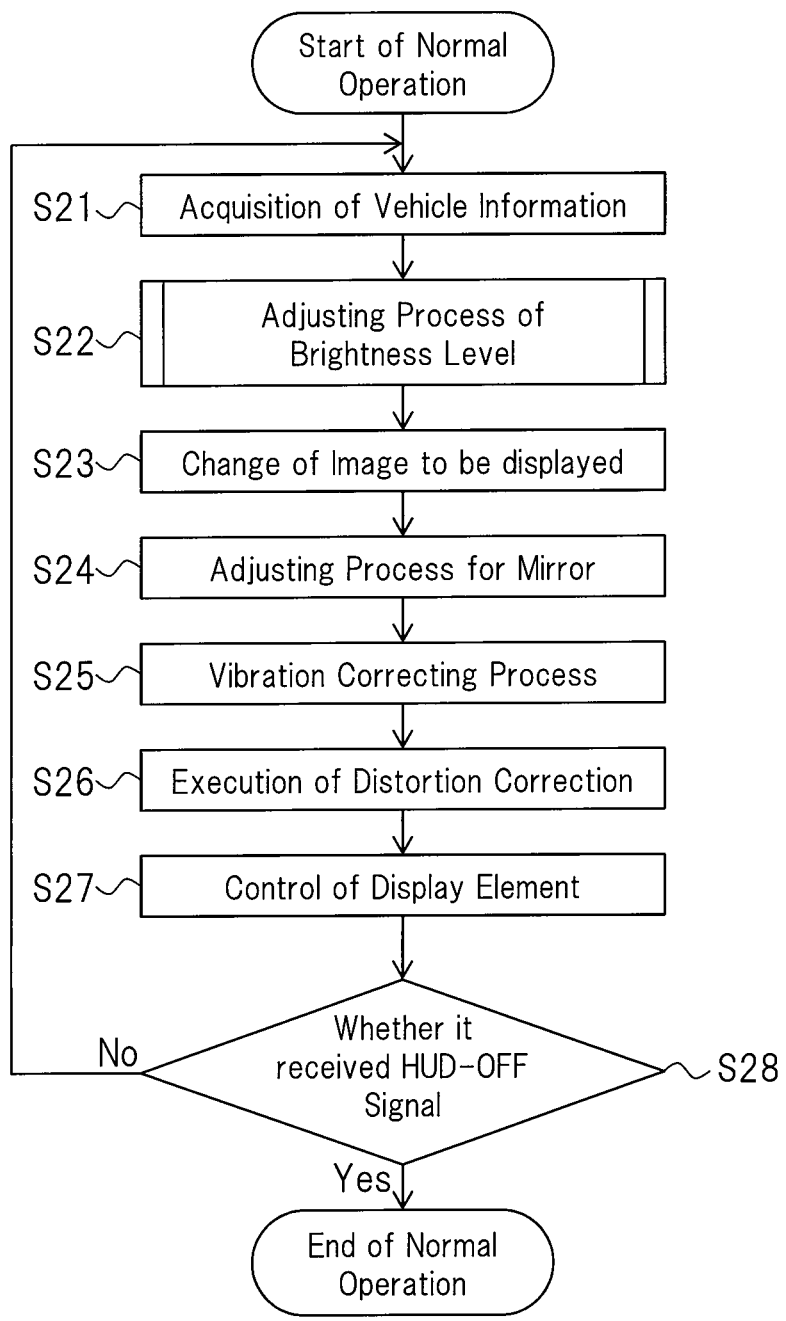
FIG. 19 is a flow chart showing an outline of an example of normal operation in the first embodiment of the present invention.

FIG. 19 is a flow chart showing an outline of an example of normal operation of the head-up display apparatus of this embodiment. In the normal operation also, a sequence of basic process is substantially the same as the initial operation shown in the above-mentioned FIG. 18. First, in the HUD apparatus 1, the vehicle information acquiring unit 10 acquires vehicle information on the basis of an instruction from the controller 20 (S21). Furthermore, on the basis of external light information acquired by the illumination sensor 105, the chromaticity sensor 106 and the like, of the vehicle information 4, the controller 20 carries out a brightness level adjusting process (S22).

Figure 20:
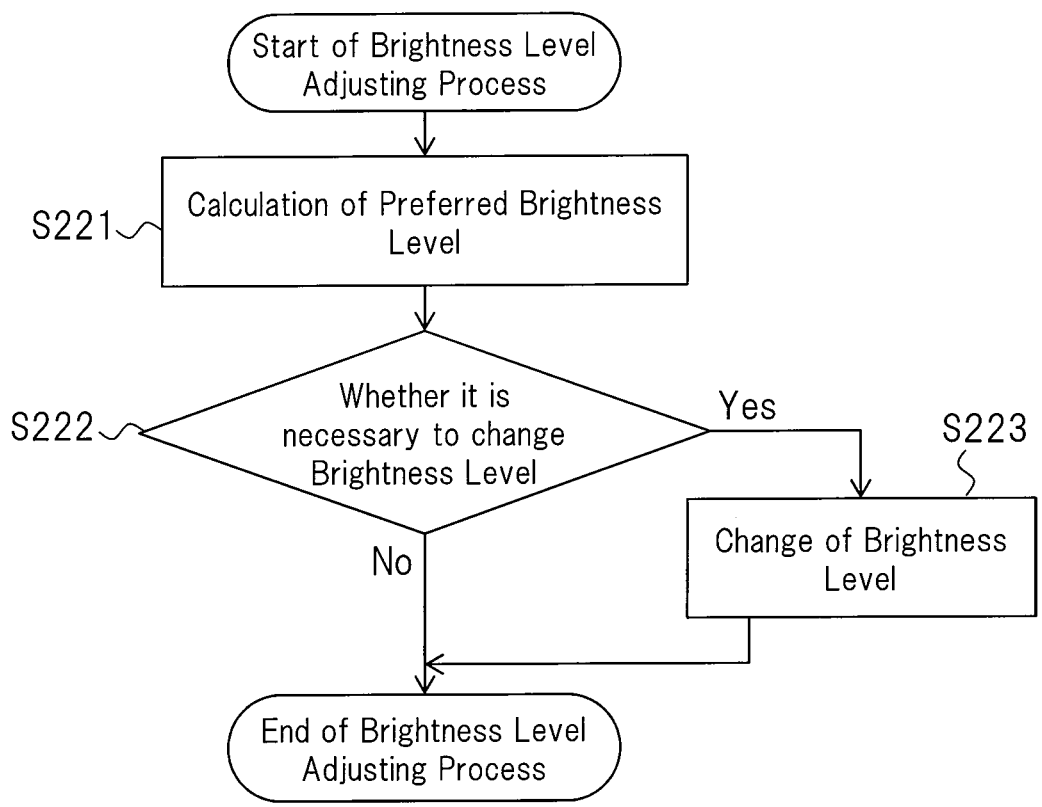
FIG. 20 is a flow chart showing an outline of an example of a brightness level adjusting process in the first embodiment of the present invention.

FIG. 20 is a flow chart showing an outline of an example of the brightness level adjusting process of the head-up display apparatus of this embodiment. The brightness level adjusting process starts, and a desired brightness level is calculated on the basis of the acquired external light information (S221). Then, by comparing it with the currently set brightness level, it is determined whether the brightness level needs to be changed (S222). When the change is necessary, the brightness level adjusting process ends as it is. On the other hand, when the change is necessary, the light source adjuster 25 controls the light emission amount of the light source 31 so that it satisfy the brightness level after the change (S223), and the brightness level adjusting process ends. Note that, in step S222, when there is a difference between the desired brightness level calculated in step S221 and the currently set brightness level, and only when the difference is equal to or larger than a predetermined threshold value, it may be determined that the brightness level needs to be changed.

Returning to FIG. 19, subsequently, on the basis of the latest vehicle information 4 acquired in step S21, ECU 21 changes an image to be displayed as a virtual image from the current one, if necessary, and determines and generates the image after the change (S23). Note that the pattern by which the display contents are altered on the basis of the vehicle information 4 may include many patterns depending on the contents of acquired vehicle information 4 and combinations or the like thereof. For example, there may be various patterns in which because of a change in speed information, the numeric value of a speed display always displayed is altered or in which an arrow sign for guidance is displayed/erased or the shape of an arrow sign or display position thereof is altered, on the basis of navigation information.

Subsequently, in this embodiment, adjusting and correcting processes for maintaining the appropriateness of the visual confirmation and display contents are carried out depending on driving states of the vehicle 2. First, when the position of the display region itself of a virtual image needs to be adjusted, mirror adjusting processes for altering the angle of the concave mirror 41 through the mirror driver 42 so as to shift the display region of the virtual image in the vertical direction are carried out (S24). Subsequently, a vibration correction process for correcting the display position of an image inside the display region relative to vibration of the vehicle 2 is further carried out (S25). Subsequently, the image that has been adjusted and corrected is further subjected to a distortion correcting process by the distortion corrector 26 (S26), and then by driving and controlling the display element 33 by the display element driver 27, an image to be projected is formed (S27).

At the time of carrying out the above-mentioned sequence of normal operation, when the power source is turned OFF or the like due to the stoppage or the like of the vehicle 2, an HUD-OFF signal is outputted to the HUD apparatus 1, and the controller 20 determines whether or not this signal has been received (S28). When the HUD-OFF signal is not received, the sequence returns to step S21, thereby repeating a sequence of normal operation until it is determined that the HUD-OFF signal is received. When it is determined that the HUD-OFF signal is received, the sequence of normal operation ends.

As described above, according to the HUD apparatus 1 of the first embodiment of the present invention, a direct optical system that uses only the concave mirror 41 without using the optical path return mirror in the virtual image optical system is adopted. Furthermore, in order to correct distortion and aberration in a virtual image generated by the concave mirror 41, the distortion correcting lens 43 is disposed between the concave mirror 41 and the display element 33. Furthermore, the housing 50 of the HUD apparatus 1 including the outer case 54 and the outer cover 51 formed along a surface forming the outermost periphery of the effective optical path region of image light is installed so as to reduce the entire capacity. By using this configuration, the HUD apparatus 1 can be further reduced in size.

Furthermore, in this embodiment, the concave mirror 41 and the distortion correcting lens 43 are held by the optical element supporting outer case 55 formed by a material having high heat resistance, high rigidity and high dimensional precision. Thus, the positional relationship between the concave mirror 41 and the distortion correcting lens 43 can be maintained with high precision. Furthermore, the light source 31, the illumination optical system 32 and the display element 33 (LCD panel or the like) are modularized as the image display apparatus 30, which is configured to be detachably attached to one portion of the outer periphery of the housing 50. In this manner, it becomes possible to improve the exchangeability of the image display apparatus 30 susceptible to damage or the like, and also improve the heat dissipating property.

Second Embodiment

Figure 2B:
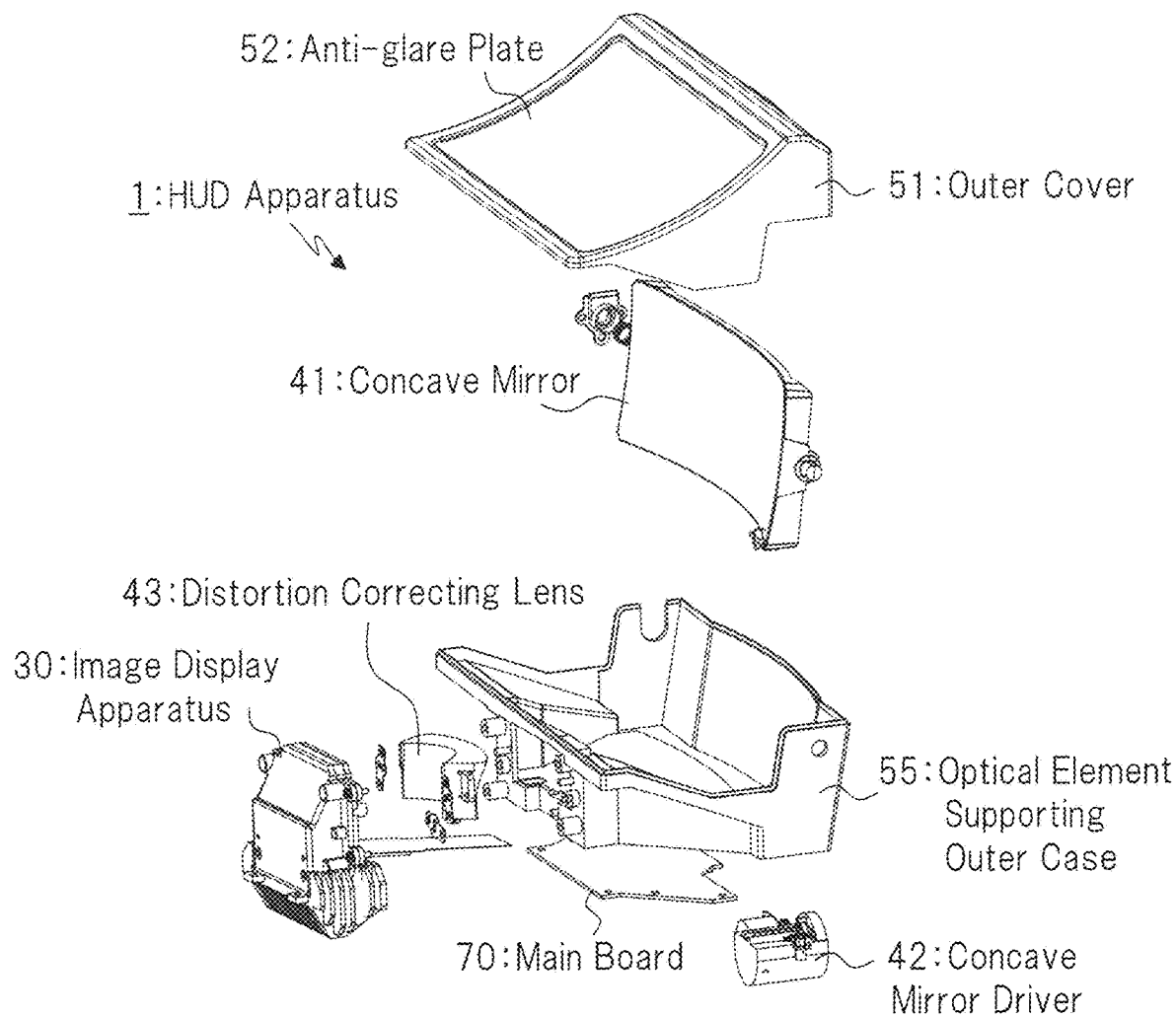

As shown in FIG. 2(b), the above-mentioned first embodiment has a configuration in which the concave mirror 41 and the distortion correcting lens 43 are held by the optical element supporting outer case 55 and these are accommodated in the housing 50 composed of the outer case 54 and the outer cover 51. At this time, in order to maintain the positional relationship between the concave mirror 41 and the distortion correcting lens 43 with high precision, and as described earlier, at least the optical element supporting outer case 55 is formed by using a material having high heat resistance, high rigidity and high dimensional precision, such as BMC or the like.

By the way, in the HUD apparatus 1 of the second embodiment, in addition to the outer case 54, as the member for holding optical members of the concave mirror 41 and the distortion correcting lens 43, a member, which is different from the above-mentioned outer case, that is, the optical element supporting member 53, is installed.

FIG. 21 is a view showing an outline of a head-up display apparatus of the second embodiment. In this case, in the same HUD apparatus 1 as that shown in the first embodiment, on the optical element supporting member 53 different from the outer case 54, the concave mirror 41 and the distortion correcting lens 43 are directly held respectively. Furthermore, in the same manner as in the optical element supporting outer case 55 shown in FIG. 2(b), the optical element supporting member 53 is made of a material having characteristics of high heat resistance, high rigidity and high dimension precision, such as BMC or the like.

Thus, the same effects as the effects obtained by the configuration of the HUD apparatus 1 in the first embodiment, such as the effect that the positional relationship between the concave mirror 41 and the distortion correcting lens 43 can be maintained with high precision, can be obtained.

The foregoing description has specifically explained the invention made by the present inventors on the basis of embodiments thereof; however, the present invention is not intended to be limited by the above-mentioned embodiments, and it is needless to say that various modifications may be made without departing from the scope of the present invention. For example, the above-mentioned embodiments are explained in detail so as to make the present invention easily understood, and the invention is not intended to be limited by the configuration provided with all the elements explained. Furthermore, one portion of the configuration of a certain embodiment may be substituted by a configuration of another embodiment, and to the configuration of a certain embodiment, a configuration of another embodiment may be added. Furthermore, to or from one portion of a configuration of each of the embodiments, another configuration may be added, omitted or substituted.

INDUSTRIAL APPLICABILITY

The present invention can be used in a head-up display apparatus configured to project an image onto a transparent glass plate and the like.

EXPLANATION OF REFERENCE CHARACTERS

1: HUD Apparatus
2: Vehicle,
3: Windshield,
4: Vehicle Information,
5: Driver,
10: Vehicle Information Acquiring Unit,
20: Controller,
21: ECU,
22: Sound Output Unit,
23: Non-Volatile Memory,
24: Memory,
25: Light Source Adjuster,
26: Distortion Corrector,
27: Display Driver,
28: Mirror Adjuster,
30: Image Display Apparatus,
31: Light Source,
31a: LED Light Source,
31b: Heat Sink,
32: Illumination Optical System,
32a: Light Funnel,
32b: Light Guide Member,
32b_1: Incident Surface,
33: Display Element,
33b_2: Opposite Surface,
32b_3: Output Surface,
32c: Diffuser Panel,
32d: Junction Portion,
33: Display Element,
34: Flexible Cable,
35: Frame,
36a, 36b: Outer Member,
41: Concave Mirror,
42: Mirror Driver,
43: Distortion Correcting Lens,
50: Housing,
51: Outer Cover,
51s: Side Surface Portion,
52: Anti-glare Plate,
53: Optical Element Supporting Member,
54: Outside Case,
55: Optical Element Supporting Outer Case,
55b: Bottom Portion,
55s: Side Surface Portion,
55mb: Intermediate Bottom surface Portion,
55us: Upper Side Surface Portion,
60: Speaker,
70: Main Board,
101: Vehicle Speed Sensor,
102: Sift Position Sensor,
103: Handle Steering Angle Sensor,
104: Headlight Sensor,
105: Illuminance Sensor,
106: Chromaticity Sensor,
107: Distance Sensor,
108: Infrared Light Sensor,
109: Engine Ignition Sensor,
110: Acceleration Sensor,
111: Gyro Sensor,
112: Temperature Sensor,
113: Receiver for Road-to-Vehicle Communication,
114: Receiver for Vehicle-to-Vehicle Communication,
115: Camera (Inside),
116: Camera (Outside),
117: GPS receiver, and
118: VICS receiver

The invention claimed is:

1. A vehicle, comprising:
a windshield;
an image display apparatus including a light source and a display element so that an image is displayed on the display element so as to generate an image projection light to be emitted;
a virtual image optical system configured to reflect the image projection light emitted from the image display apparatus by the windshield or a combiner of the vehicle so that a virtual image is displayed in the front side of the vehicle; and
a housing in which the virtual image optical system is accommodated,
wherein the virtual image optical system includes a mirror,
the housing includes a bottom surface portion formed along an optical path of the image light that is emitted from the image display apparatus to the mirror, and an intermediate bottom that has a tilt angle different from that of the bottom surface portion and is formed along an optical path of reflected light reflected by the mirror.

2. The vehicle according to claim 1, wherein
the housing includes a wall surface formed along a shape of an effective optical path region of the image light from the image display apparatus.

3. The vehicle according to claim 1, wherein
the image display apparatus is attached to one portion of an outer periphery of the housing.

4. The vehicle according to claim 1, wherein
the housing further includes side surface portions that rise from two side ends of the bottom surface and an upper side surface portion that rises from an end of the intermediate bottom surface portion.

5. The vehicle according to claim 1, wherein
the housing is constituted by an outer case in which the mirror is accommodated, and an outer cover that is integrally assembled on an upper portion of the outer case and has a member for transmitting reflected light reflected by the mirror.

6. The vehicle according to claim 1, wherein
the side surface portions, the intermediate bottom surface portion and the upper side surface portion forming the housing are formed so as to be separated outside from the outermost periphery of an effective optical path region of the image light, with a distance in a range from 1 mm or more to less than 15 mm.

7. The vehicle according to claim 1, wherein the light source is provided with heat dissipating means.

8. The vehicle according to claim 7, wherein the heat dissipating means of the light source is positioned on the outer periphery of the housing.

9. The vehicle according to claim 7, wherein the heat dissipating means is a heat sink.

10. The vehicle according to claim 1, wherein the mirror includes a mirror driver for driving the mirror.

11. The vehicle according to claim 1, further comprising:
a substrate on which a controller for controlling operations of the respective parts including the light source and the display element is assembled is attached to one portion of the outer periphery of the housing.

12. The vehicle according to claim 1, wherein
the light source and the display element constituting an image display apparatus is disposed so as to be tilted relative to an optical axis of the concave mirror.

13. The vehicle according to claim 1, wherein
the mirror is held on a holding member or an outer case having an angle adjusting mechanism.

14. The vehicle according to claim 13, wherein
the angle adjusting mechanism is configured to adjust the angle of the mirror, to adjust a projection position onto a windshield, and to make the position of a virtual image seen by the driver adjustable in the vertical direction.

15. A vehicle, comprising:
a windshield;
an image display apparatus including a light source and a display element so that an image is displayed on the display element so as to generate an image projection light to be emitted;
a virtual image optical system configured to reflect the image projection light emitted from the image display apparatus by the windshield or a combiner of the vehicle so that a virtual image is displayed in the front side of the vehicle; and a housing in which the virtual image optical system is accommodated, wherein the virtual image optical system includes a mirror,
the housing is constituted by an outer case in which the mirror is accommodated, and an outer cover that is integrally assembled on an upper portion of the outer case and has a member for transmitting reflected light reflected by the mirror.

16. The vehicle according to claim 15, wherein
the housing includes a wall surface formed along a shape of an effective optical path region of the image light from the image display apparatus.

17. The vehicle according to claim 15, wherein
the image display apparatus is attached to one portion of an outer periphery of the housing.

18. The vehicle according to claim 15, wherein
the housing includes a bottom surface portion formed along an optical path of the image light that is emitted from the display element to the mirror, and an intermediate bottom that has a tilt angle different from that of the bottom surface portion and is formed along an optical path of reflected light reflected by the mirror.

19. The vehicle according to claim 15, wherein
the housing further includes side surface portions that rise from two side ends of the bottom surface and an upper side surface portion that rises from an end of the intermediate bottom surface portion.

20. The vehicle according to claim 15, wherein
the side surface portions, the intermediate bottom surface portion and the upper side surface portion forming the housing are formed so as to be separated outside from the outermost periphery of an effective optical path region of the image light, with a distance in a range from 1 mm or more to less than 15 mm.

21. The vehicle according to claim 15, wherein
the light source is provided with heat dissipating means.

22. The vehicle according to claim 21, wherein
the heat dissipating means of the light source is positioned on the outer periphery of the housing.

23. The vehicle according to claim 21, wherein the heat dissipating means is a heat sink.

24. The vehicle according to claim 15, wherein
the mirror includes a mirror driver for driving the mirror.

25. The vehicle according to claim 15, further comprising:
a substrate on which a controller for controlling operations of the respective parts including the light source and the display element is assembled is attached to one portion of the outer periphery of the housing.

26. The vehicle according to claim 15, wherein
the light source and the display element constituting an image display apparatus is disposed so as to be tilted relative to an optical axis of the concave mirror.

27. The vehicle according to claim 15, wherein
the mirror is held on a holding member or an outer case having an angle adjusting mechanism.

28. The vehicle according to claim 27, wherein
the angle adjusting mechanism is configured to adjust the angle of the mirror, to adjust a projection position onto a windshield, and to make the position of a virtual image seen by the driver adjustable in the vertical direction.

29. A vehicle, comprising:
a windshield;
an image display apparatus including a light source and a display element so that an image is displayed on the display element so as to generate an image projection light to be emitted;
a virtual image optical system configured to reflect the image projection light emitted from the image display apparatus by the windshield or a combiner of the vehicle so that a virtual image is displayed in the front side of the vehicle; and
a housing in which the virtual image optical system is accommodated,
wherein the virtual image optical system includes a mirror,
the concave mirror is held on a holding member of an outer case having an angle adjusting mechanism, and
the angle adjusting mechanism is configured to adjust the angle of the concave mirror, to adjust a projection position onto a windshield, and to make the position of a virtual image seen by the driver adjustable in the vertical direction.

30. The vehicle according to claim 29, wherein
the housing includes a wall surface formed along a shape of an effective optical path region of the image light from the image display apparatus.

31. The vehicle according to claim 29, wherein
the image display apparatus is attached to one portion of an outer periphery of the housing.

32. The vehicle according to claim 29, wherein
the housing includes a bottom surface portion formed along a bottom surface of an optical path of the image light that is emitted from the image display apparatus to the mirror, and an intermediate bottom that has a tilt angle different from that of the bottom surface portion and is formed along a bottom surface of an optical path of reflected light reflected by the mirror.

33. The vehicle according to claim 32, wherein
the housing further includes side surface portions that rise from two side ends of the bottom surface and an upper side surface portion that rises from an end of the intermediate bottom surface portion.

34. The vehicle according to claim 29, wherein
the housing is constituted by an outer case in which the mirror is accommodated, and an outer cover that is integrally assembled on an upper portion of the outer case and has a member for transmitting reflected light reflected by the mirror.

35. The vehicle according to claim 29, wherein
the side surface portions, the intermediate bottom surface portion and the upper side surface portion forming the housing are formed so as to be separated outside from the outermost periphery of an effective optical path region of the image light, with a distance in a range from 1 mm or more to less than 15 mm.

36. The vehicle according to claim 29, wherein
the light source is provided with heat dissipating means.

37. The vehicle according to claim 36, wherein
the heat dissipating means of the light source is positioned on the outer periphery of the housing.

38. The vehicle according to claim 36, wherein
the heat dissipating means is a heat sink.

39. The vehicle according to claim 29, wherein
the mirror includes a mirror driver for driving the mirror.

40. The vehicle according to claim 29, further comprising:
a substrate on which a controller for controlling operations of the respective parts including the light source and the display element is assembled is attached to one portion of the outer periphery of the housing.

41. The vehicle according to claim 29, wherein
the light source and the display element constituting an image display apparatus is disposed so as to be tilted relative to an optical axis of the concave mirror.

42. A vehicle, comprising:
a windshield;
a light source;
a display element that a light from the light source emits as an image projection light;
a virtual image optical system configured to reflect the image projection light emitted from the display element by the windshield or a combiner of the vehicle so that a virtual image is displayed in the front side of the vehicle; and
a housing in which the virtual image optical system is accommodated, wherein the virtual image optical system includes a mirror,
the housing includes a first surface formed along an optical path of the image light that is emitted from the display element to the mirror, and a second surface that has a tilt angle different from that of the first surface and is formed along an optical path of reflected light reflected by the mirror.

43. The vehicle according to claim 42, wherein
the housing includes a wall surface formed along a shape of an effective optical path region of the image light from the image display apparatus.

44. The vehicle according to claim 42, wherein
an image display apparatus including the light source and the display element,
the image display apparatus is attached to one portion of an outer periphery of the housing.

45. The vehicle according to claim 42, wherein
the housing further includes side surface portions that rise from two side ends of the first surface and an upper side surface portion that rises from an end of the second surface portion.

46. The vehicle according to claim 42, wherein
the housing is constituted by an outer case in which the mirror is accommodated, and an outer cover that is integrally assembled on an upper portion of the outer case and has a member for transmitting reflected light reflected by the mirror.

47. The vehicle according to claim 42, wherein
the side surface portions, the second surface portion and the upper side surface portion forming the housing are formed so as to be separated outside from the outermost periphery of an effective optical path region of the image light, with a distance in a range from 1 mm or more to less than 15 mm.

48. The vehicle according to claim 42, wherein
the light source is provided with heat dissipating means.

49. The vehicle according to claim 48, wherein
the heat dissipating means of the light source is positioned on the outer periphery of the housing.

50. The vehicle according to claim 48, wherein
the heat dissipating means is a heat sink.

51. The vehicle according to claim 42, wherein
the mirror includes a mirror driver for driving the mirror.

52. The vehicle according to claim 42, further comprising:
a substrate on which a controller for controlling operations of the respective parts including the light source and the display element is assembled is attached to one portion of the outer periphery of the housing.

53. The vehicle according to claim 42, wherein
the light source and the display element constituting an image display apparatus is disposed so as to be tilted relative to an optical axis of the concave mirror.

54. The vehicle according to claim 42, wherein
the mirror is held on a holding member or an outer case having an angle adjusting mechanism.

55. The vehicle according to claim 54, wherein
the angle adjusting mechanism is configured to adjust the angle of the mirror, to adjust a projection position onto a windshield, and to make the position of a virtual image seen by the driver adjustable in the vertical direction.

* * * * *